(12) United States Patent
Sakai et al.

(10) Patent No.: US 8,630,118 B2
(45) Date of Patent: Jan. 14, 2014

(54) DEFECTIVE WORD LINE DETECTION

(75) Inventors: Manabu Sakai, Kanagawa (JP); Toru Miwa, Kanagawa (JP)

(73) Assignee: SanDisk Technologies Inc., Plano, TX (US)

( * ) Notice: Subject to any disclaimer, the term of this patent is extended or adjusted under 35 U.S.C. 154(b) by 56 days.

(21) Appl. No.: 13/292,556

(22) Filed: Nov. 9, 2011

(65) Prior Publication Data

US 2013/0114342 A1   May 9, 2013

(51) Int. Cl.
*G11C 16/04* (2006.01)

(52) U.S. Cl.
USPC ............ 365/185.17; 365/185.18; 365/185.23; 365/185.2

(58) Field of Classification Search
USPC ............... 365/185.17–185.18, 185.23, 185.2, 365/185.09, 148
See application file for complete search history.

(56) References Cited

U.S. PATENT DOCUMENTS

| | | | |
|---|---|---|---|
| 5,936,890 A | 8/1999 | Yeom | |
| 6,278,632 B1 | 8/2001 | Chevallier | |
| 6,601,191 B1 | 7/2003 | Norman et al. | |
| 6,907,497 B2 | 6/2005 | Hosono et al. | |
| 6,914,823 B2 | 7/2005 | Chen et al. | |
| 6,917,542 B2 | 7/2005 | Chen et al. | |
| 7,117,296 B2 | 10/2006 | Hosono et al. | |
| 7,120,051 B2 | 10/2006 | Gorobets et al. | |
| 7,206,230 B2 | 4/2007 | Li et al. | |
| 7,304,893 B1 | 12/2007 | Hemink | |
| 7,345,928 B2 | 3/2008 | Li | |
| 7,392,436 B2 | 6/2008 | Keays | |
| 7,420,847 B2 | 9/2008 | Li | |
| 7,502,260 B2 | 3/2009 | Li | |
| 7,508,721 B2 | 3/2009 | Li et al. | |
| 7,599,223 B2 * | 10/2009 | Tu et al. ................... | 365/185.22 |
| 7,623,388 B2 | 11/2009 | Chen et al. | |
| 8,014,205 B2 * | 9/2011 | Hemink .................. | 365/185.18 |
| 2003/0214853 A1 | 11/2003 | Hosono et al. | |
| 2005/0024939 A1 | 2/2005 | Chen et al. | |
| 2006/0221690 A1 | 10/2006 | Rehm | |
| 2007/0206426 A1 | 9/2007 | Mokhlesi | |
| 2007/0279985 A1 | 12/2007 | Hemink | |
| 2008/0062770 A1 | 3/2008 | Tu et al. | |
| 2008/0127104 A1 | 5/2008 | Li et al. | |
| 2008/0225597 A1 | 9/2008 | Park | |

(Continued)

OTHER PUBLICATIONS

International Search Report and Written Opinion of the International Searching Authority dated Feb. 6, 2013, PCT Application No. PCT/US2012/064150 filed Nov. 8, 2012, 12 pages.
International Search Report and Written Opinion of the International Searching Authority dated Jul. 15, 2013, PCT Application No. PCT/US2012/064152, filed Nov. 8, 2012, 13 pages.

(Continued)

*Primary Examiner* — David Lam
(74) *Attorney, Agent, or Firm* — Vierra Magen Marcus LLP

(57) ABSTRACT

Methods and non-volatile storage systems are provided for detecting defects in word lines. A "broken" word line defect may be detected. Information may be maintained as to which storage elements were intended to be programmed to a tracked state. Then, after programming is complete, the storage elements are read to determine which storage elements have a threshold voltage below a reference voltage level associated with the tracked state. By tracking which storage elements are in the tracked state, elements associated with other states may be filtered out such that an accurate assessment may be made as to which storage elements were under-programmed. From this information, a determination may be made whether the word line is defective. For example, if too many storage elements are under-programmed, this may indicate a broken word line.

26 Claims, 26 Drawing Sheets

(56) References Cited

U.S. PATENT DOCUMENTS

| | | |
|---|---|---|
| 2008/0273386 A1 | 11/2008 | Pyeon |
| 2009/0175097 A1 | 7/2009 | Chen et al. |
| 2009/0262578 A1 | 10/2009 | Li et al. |
| 2010/0002514 A1 | 1/2010 | Lutze et al. |
| 2010/0034019 A1 | 2/2010 | Kang et al. |
| 2010/0329029 A1 | 12/2010 | Yun et al. |
| 2010/0329052 A1 | 12/2010 | Chen et al. |
| 2011/0110153 A1 | 5/2011 | Dutta et al. |
| 2011/0182121 A1 | 7/2011 | Dutta et al. |

OTHER PUBLICATIONS

Partial International Search Report dated May 28, 2013, PCT Application No. PCT/US2012/064152, filed Nov. 8, 2012, 4 pages.

Office Action dated Jun. 4, 2013, U.S. Appl. No. 13/292,569, filed Nov. 9, 2011, 26 pages.

Response A to Office Action dated Aug. 20, 2013, U.S. Appl. No. 13/292,569, filed Nov. 9, 2011, 15 pages.

Response to Final Office Action dated Dec. 3, 2013, U.S. Appl. No. 13/292,569, filed Nov. 9, 2011, 13 pages.

\* cited by examiner

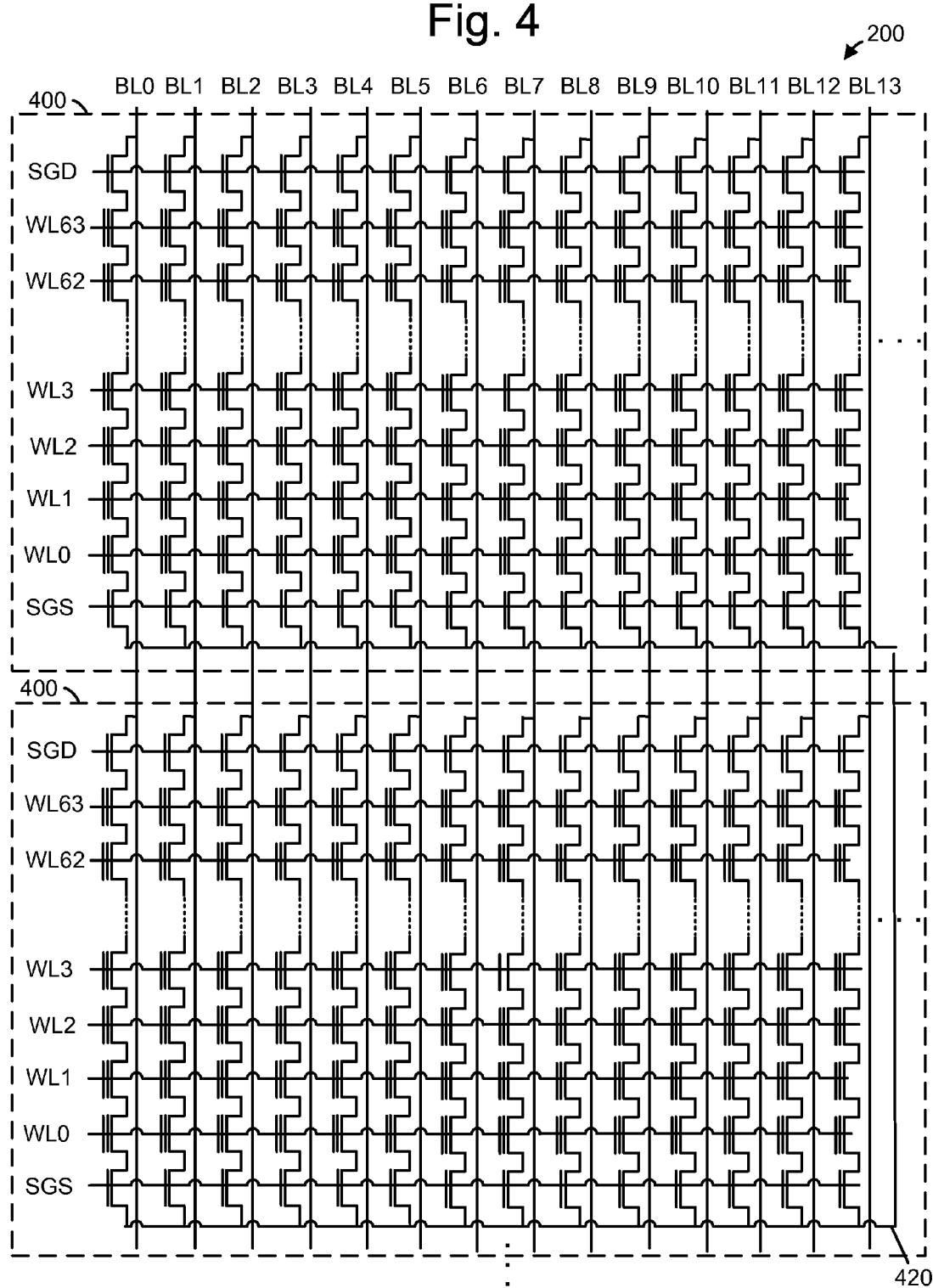

| State | Er Lockout | A Program | B Program | C Program | D Program | E Program | F Program | G Program |
|---|---|---|---|---|---|---|---|---|
| CDL | 1 | 0 | 1 | 0 | 1 | 0 | 1 | 0 |
| BDL | 1 | 1 | 0 | 0 | 1 | 1 | 0 | 0 |
| ADL | 1 | 1 | 1 | 1 | 0 | 0 | 0 | 0 |
| DDL | 1 | 0 | 0 | 0 | 0 | 0 | 0 | 0 |

Fig. 13A

| State | Er Lockout | A Program | B Program | C Program | D Program | E Program | F Program | G Program | Lockout |
|---|---|---|---|---|---|---|---|---|---|
| CDL | 1 | 0 | 1 | 0 | 1 | 0 | 1 | 0 | 1 |
| BDL | 1 | 1 | 0 | 0 | 1 | 1 | 0 | 0 | 1 |
| ADL | 1 | 1 | 1 | 1 | 0 | 0 | 0 | 0 | 1 |
| DDL | 1 | QPW | QPW | QPW | QPW | QPW | QPW | 0 | 0 |

Fig. 13B

| State | Er Lockout | A Lockout | B Lockout | C Lockout | D Lockout | E Program | F Program | G Program | Lockout |
|---|---|---|---|---|---|---|---|---|---|
| CDL | 1 | 1 | 1 | 1 | 1 | 0 | 1 | 0 | 1 |
| BDL | 1 | 1 | 1 | 1 | 1 | 1 | 0 | 0 | 1 |
| ADL | Available ||||||||| 
| DDL | 1 | 1 | 1 | 1 | 1 | QPW | QPW | 0 | 0 |

Fig. 13C

| State | Er Lockout | A Lockout | B Lockout | C Lockout | D Lockout | E Lockout | F Lockout | G Program | Lockout |
|---|---|---|---|---|---|---|---|---|---|
| CDL | 1 | 1 | 1 | 1 | 1 | 1 | 1 | 0 | 1 |
| BDL | Available ||||||||| 
| ADL | Available ||||||||| 
| DDL | 1 | 1 | 1 | 1 | 1 | 1 | 1 | 0 | 0 |

Fig. 13D

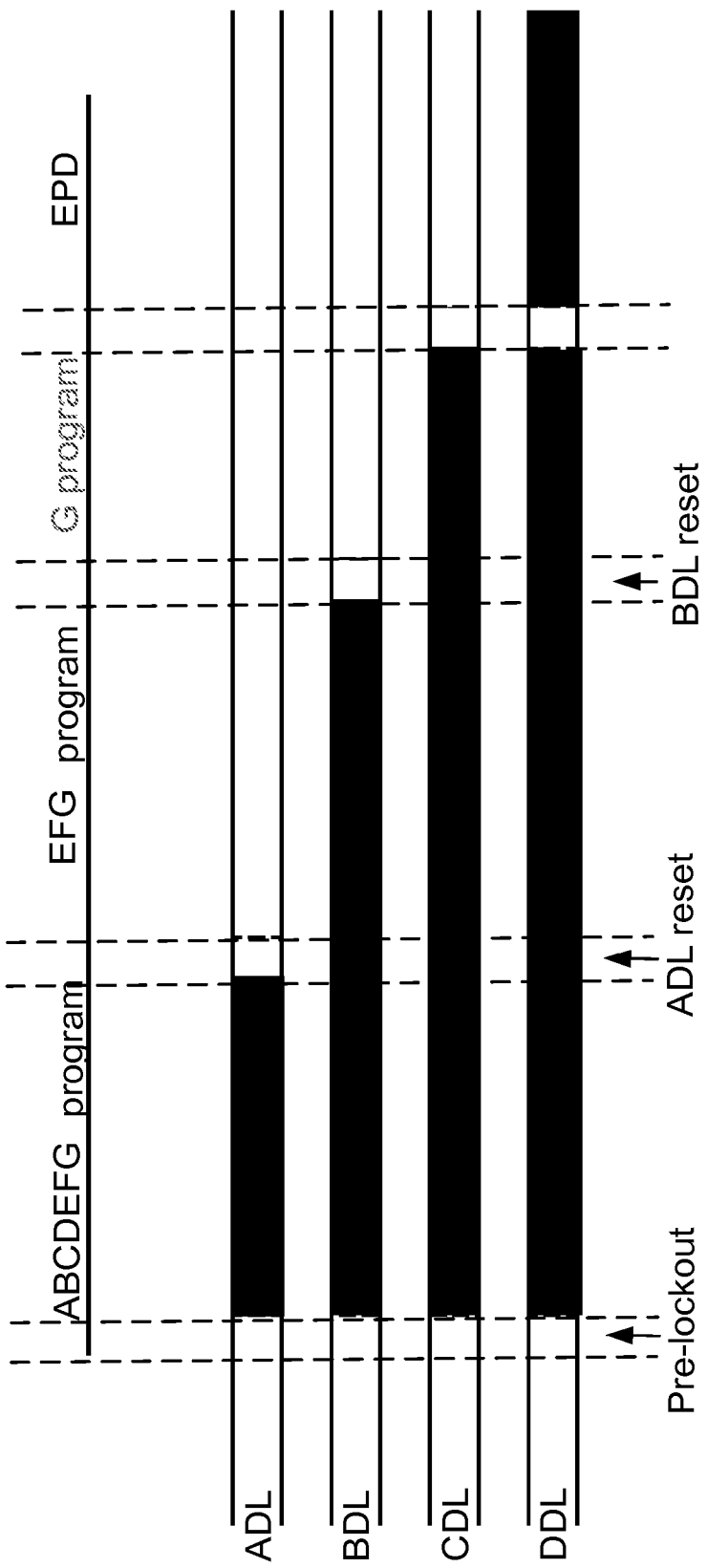

| State | Er Lockout | A Lockout | B Lockout | C Lockout | D Lockout | E Lockout | F Lockout | G Lockout |
|---|---|---|---|---|---|---|---|---|
| CDL | 1 | 1 | 1 | 1 | 1 | 1 | 1 | 0 / 1 |
| DDL | 1 | 1 | 1 | 1 | 1 | 1 | 1 | 0 |
| SDL | 0 / 1 | 0 / 1 | 0 / 1 | 0 / 1 | 0 / 1 | 0 / 1 | 0 / 1 | 0 / 1 |

| State | Er Lockout | A Lockout | B Lockout | C Lockout | D Lockout | E Lockout | F Lockout | G Lockout |
|---|---|---|---|---|---|---|---|---|
| CDL | 0 | 0 / 1 | 0 | 0 | 0 | 0 | 0 | 0 |
| DDL | 0 | 1 | 0 | 0 | 0 | 0 | 0 | 0 |
| SDL | 0 / 1 | 0 / 1 | 0 / 1 | 0 / 1 | 0 / 1 | 0 / 1 | 0 / 1 | 0 / 1 |

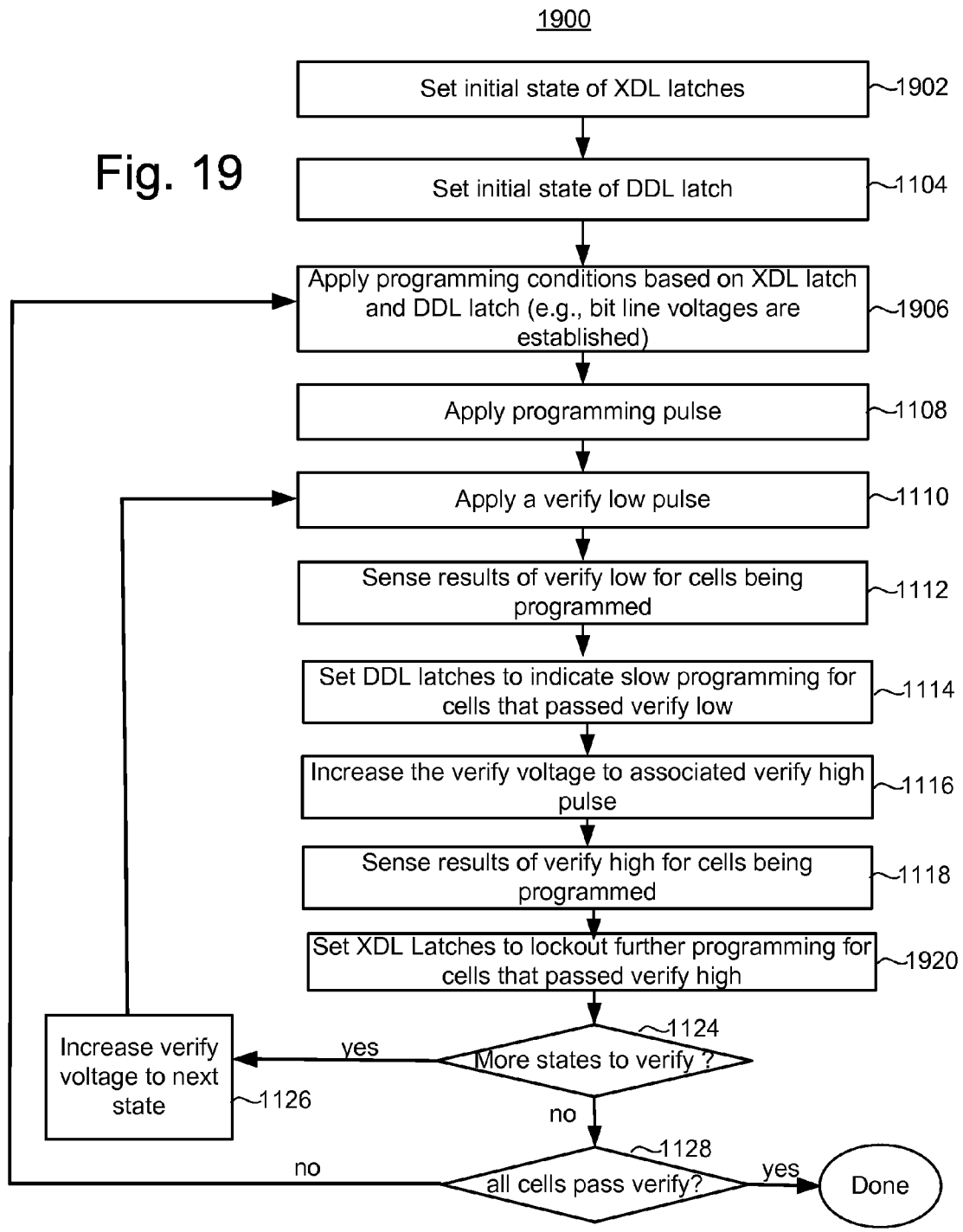

Fig. 20A

| State | Er Lockout | A Program | B Program | C Program | D Program | E Program | F Program | G Program |
|---|---|---|---|---|---|---|---|---|
| CDL | 1 | 0 | 1 | 0 | 1 | 1 | 0 | 0 |
| BDL | 1 | 1 | 0 | 0 | 1 | 0 | 0 | 0 |
| ADL | 1 | 1 | 1 | 1 | 0 | 0 | 0 | 0 |
| DDL | 1 | 0 | 0 | 0 | 0 | 0 | 0 | 0 |
| XDL | 1 | 0 | 0 | 0 | 0 | 0 | 0 | 0 |

Fig. 20B

| State | Er Lockout | Er Program | A Lockout | A Program | B Lockout | B Program | C Lockout | C Program | D Lockout | D Program | E Lockout | E Program | F Lockout | F Program | G Lockout | G Program |
|---|---|---|---|---|---|---|---|---|---|---|---|---|---|---|---|---|
| CDL | 1 | 0 | 0 | 1 | 1 | 0 | 0 | 1 | 1 | 1 | 0 | 1 | 0 | 1 | 0 | 0 |
| BDL | 1 | 1 | 1 | 0 | 0 | 1 | 0 | 1 | 1 | 0 | 1 | 0 | 1 | 0 | 0 | 0 |
| ADL | 1 | 1 | 1 | 1 | 1 | 0 | 1 | 1 | 0 | 1 | 0 | 0 | 0 | 0 | 0 | 0 |
| DDL | 1 | QPW | QPW | 1 | QPW | 1 | QPW | 1 | QPW | 1 | QPW | 1 | QPW | 1 | 0 | 1 |
| XDL | 1 | 0 | 1 | 0 | 1 | 0 | 1 | 0 | 1 | 0 | 1 | 0 | 1 | 0 | 1 | 1 |

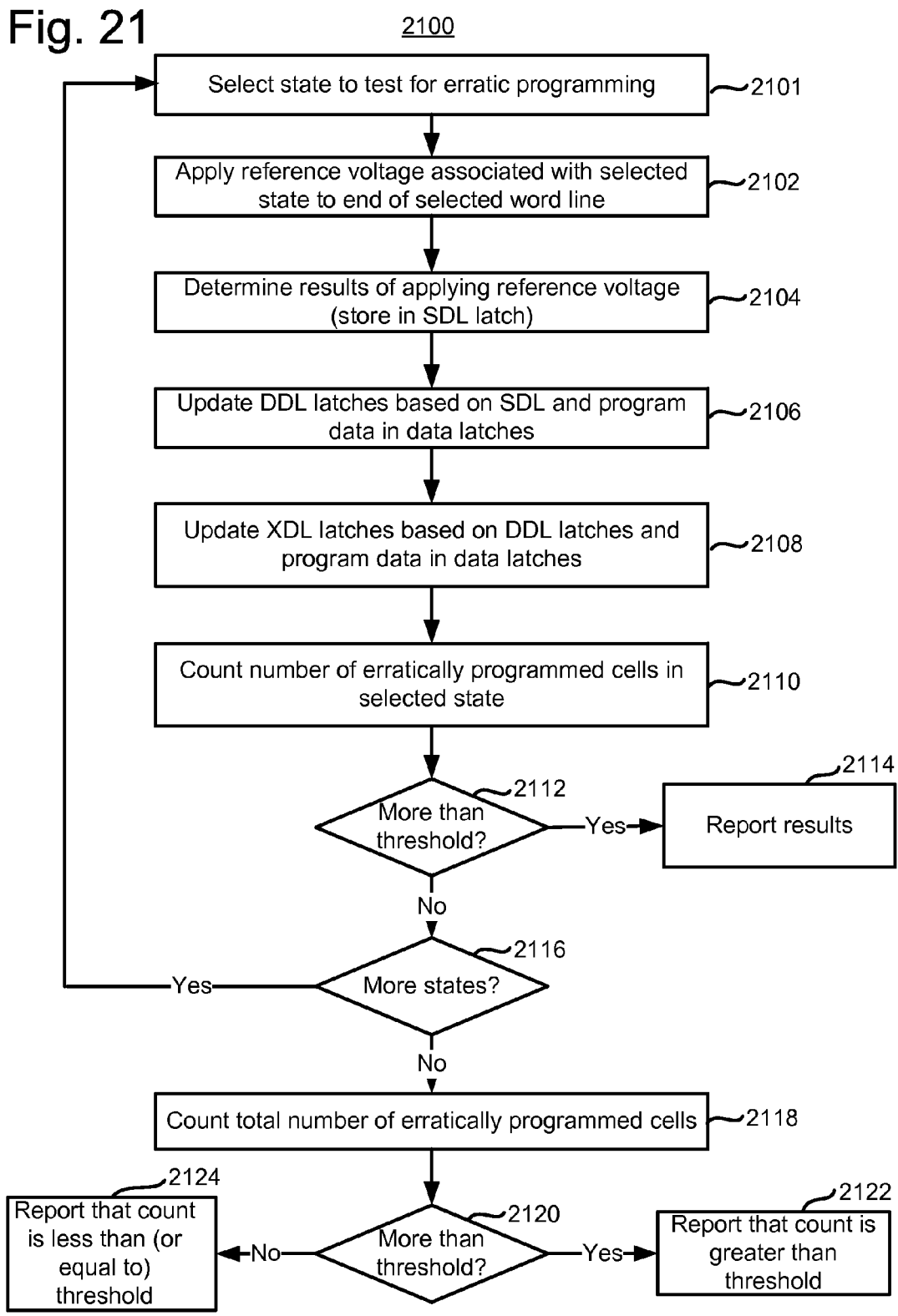

| State | Er Lockout | A Lockout | B Lockout | C Lockout | D Lockout | E Lockout | F Lockout | G Lockout |
|---|---|---|---|---|---|---|---|---|
| CDL | 1 | 0 | 1 | 0 | 1 | 0 | 1 | 0 |
| BDL | 1 | 1 | 0 | 0 | 1 | 1 | 0 | 0 |
| ADL | 1 | 1 | 1 | 1 | 0 | 1 | 1 | 0 |
| DDL | 1 | 1 | 1 | 1 | 1 | 1 | 1 | 0/1 |
| XDL | 1 | 1 | 1 | 1 | 0/1 | 0/1 | 1 | 0/1 |
| SDL | 0/1 | 0/1 | 0/1 | 0/1 | 0/1 | 0/1 | 0/1 | 0/1 |

| State | Er Lockout | A Lockout | B Lockout | C Lockout | D Lockout | E Lockout | F Lockout | G Lockout |
|---|---|---|---|---|---|---|---|---|
| CDL | 1 | 0 | 1 | 0 | 1 | 0 | 1 | 0 |
| BDL | 1 | 1 | 0 | 0 | 1 | 1 | 0 | 0 |
| ADL | 1 | 1 | 1 | 1 | 0 | 1 | 1 | 1 |
| DDL | 1 | 1 | 1 | 1 | 1 | 0/1 | 1 | 0/1 |
| XDL | 1 | 1 | 1 | 1 | 0/1 | 0/1 | 1 | 0/1 |
| SDL | 0/1 | 0/1 | 0/1 | 0/1 | 0/1 | 0/1 | 0/1 | 0/1 |

DEFECTIVE WORD LINE DETECTION

BACKGROUND

The present disclosure relates to technology for non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM. The array of storage elements may be divided into a large number of blocks of storage elements.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate. Thus, a storage element may be read by applying a reference voltage to it control gate and sensing the magnitude of the current that flows between its drain and source.

A storage element may be programmed by applying suitable programming voltages to its control gate. Typically, a program voltage Vpgm applied to the control gate during a program operation is applied as a series of pulses that increase in magnitude over time.

For some architecture, the control gates of many storage elements are electrically connected. Typically, the term "word line" is used to refer to this electrical connection of many storage elements. Therefore, a common voltage may be applied to many storage elements at the same time. One end of the word line is driven by a read reference voltage in order to read many storage elements at once. Likewise, one end of the word line is driven by a programming voltage in order to program many storage elements at once.

However, if the word line has some sort of a defect, then the read reference voltage or the programming voltage may not be properly applied to each of the storage elements on the selected word line. Therefore, errors may occur when programming or reading the storage elements.

BRIEF DESCRIPTION OF THE DRAWINGS

FIG. 4 depicts blocks of NAND flash memory cells in the memory array of FIG. 2.

FIG. 13A, FIG. 13B, FIG. 13C, and FIG. 13D are tables that show status of data latches ADL, BDL, CDL, and DDL throughout various stages of the process of FIG. 12.

FIG. 14 shows latch usage during various stages of one embodiment of programming.

FIG. 19 is a flowchart of one embodiment of a process for programming storage elements and maintaining program data in latches.

FIG. 20A depicts one example of how latches may be used during one embodiment of programming.

FIG. 20B shows a table that demonstrates how latches may be used during one embodiment of programming.

FIG. 21 is a flowchart of one embodiment of a process of erratic program detection for non-volatile storage elements.

DETAILED DESCRIPTION

Methods and non-volatile storage systems are provided for detecting defects in word lines. In one embodiment, a "broken" word line defect is detected. Note that the term "broken" word line refers to a portion of the word line that has an abnormally high resistance. Some broken word lines may result in under-programmed storage elements. However, the storage elements may not show up as being under-programmed during the verify stage of programming. For example, if the resistance is only slightly higher than normal, then this may not show up during programming as a program defect. On the other hand, if the resistance is extremely high, it might get detected during programming. Embodiments disclosed herein are able to detect cases in which the resistance is higher than normal (such that it causes under-programmed cells), even though the resistance is not high enough such that it is detected during programming as an error. Embodiments disclosed herein detect broken word lines and other defects after programming has completed.

Figure 5A:
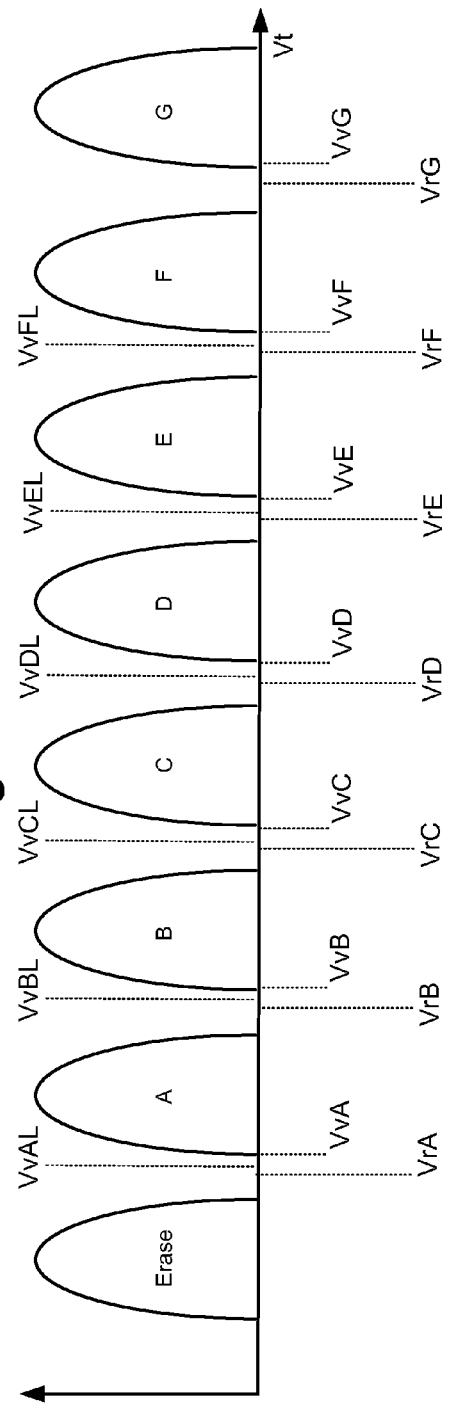
FIG. 5A depicts an example set of threshold voltage distributions for an eight-state memory device in which each storage element stores three bits of data.

Note that it can be very difficult to detect such conditions. Each storage element could store one, two, three, four, or more bits. In one approach, storage elements are programmed to $2^n$ states to store "n" bits. Referring briefly to FIG. 5A, each state (erase and A-G) may be assigned a unique range of threshold voltages. In the example of FIG. 5A, there is a considerable gap between states. In one possible approach, the gap between threshold voltage distributions may be used to define a "forbidden area." In one possible approach, a storage element with a threshold voltage in the forbidden region is either over- or under-programmed.

In one possible approach, two reads (one each at two reference voltages) could be performed to count the number of storage elements that fall within the two reference voltages. This may be used to count under-programmed storage elements, if there is considerable gap between states. However, as more bits are stored per storage element, the gap between states shrinks. A possible reason for the gap to shrink is floating gate to floating gate coupling. It is even possible for there to be some overlap between threshold voltage distributions, as in FIG. 5C. Therefore, it can be difficult to define a forbidden region between states. Thus, even if reads at two reference voltage are made, it might not be possible to tell whether the storage elements that fall within the two reference voltages are either over- or under-programmed.

Figure 5B:
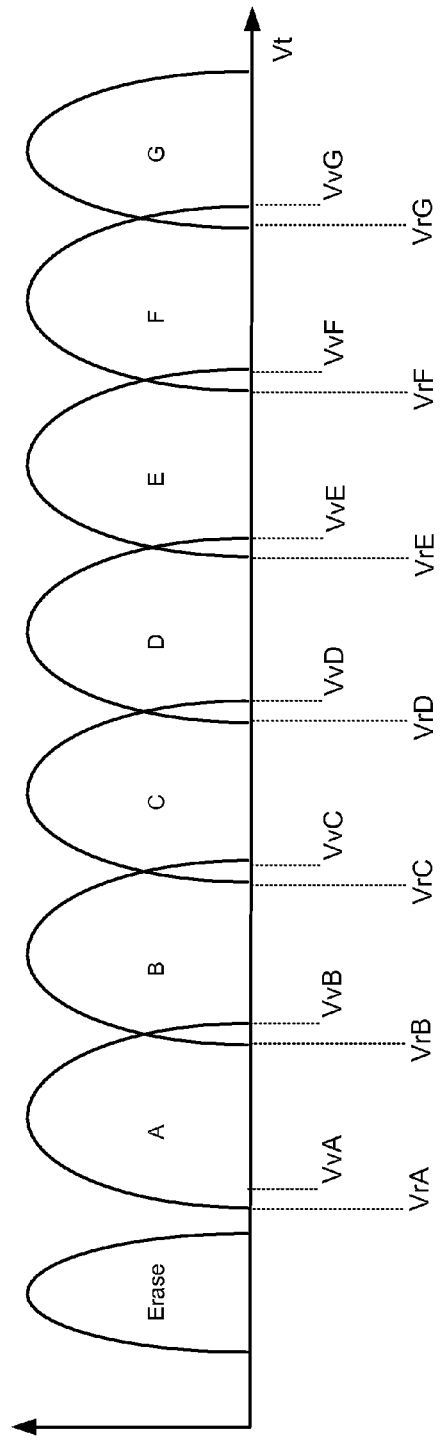
FIG. 5B illustrates that Vt distributions can partially overlap.
Figure 5C:
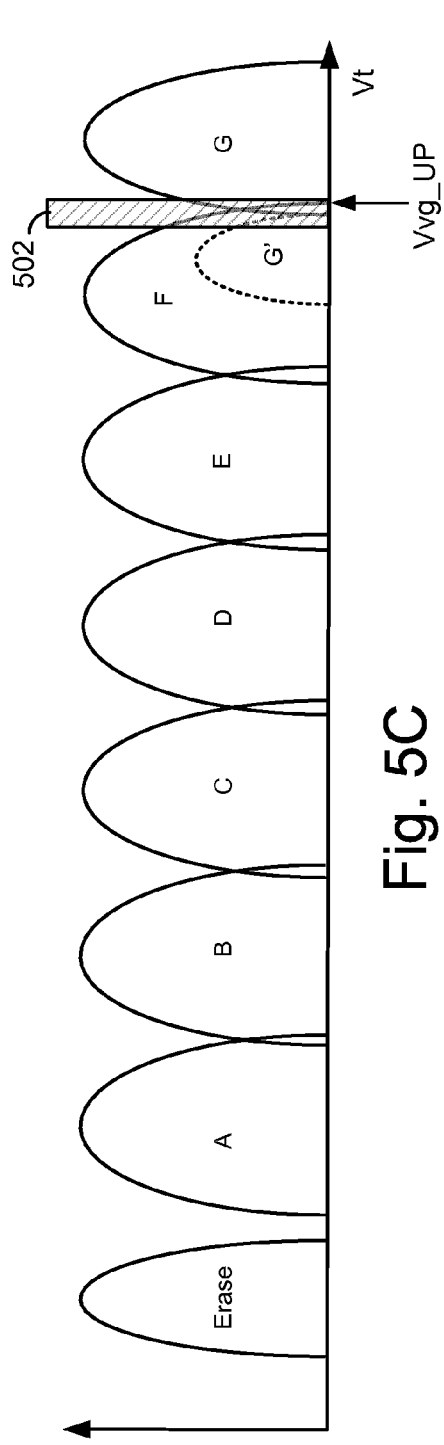
FIG. 5C illustrates that Vt distributions with a region for detecting mis-programmed cells, and a reference voltage used in one embodiment for detecting defects.

Referring to FIG. 5C, it is possible for there to be a separate threshold voltage distribution G' for memory cells that were intended to be programmed to the G-state, but that were under-programmed as a result of being past a "break" in the word line. If a read were to be made to count the total number of memory cells in a "forbidden region" 502, this count could miss most of the memory cells in the G' distribution. Note that the width and height of the G' region could vary considerably depending on the location of the break along the word line, as well as the nature of the break (e.g., its resistance).

However, in one embodiment, a read is performed at Vgv_UP (e.g., an under-program reference voltage), to determine which memory cells have a threshold voltage below Vgv_UP. This may be performed during an erratic program detection (EPD), after programming has completed. Also, information is maintained as to which storage elements were intended to be programmed to, in this example, the G-state. Therefore, the memory cells in the G' distribution can be identified. Therefore, a broken word line may be detected.

In one embodiment, information is maintained as to which storage elements were intended to be programmed to a tracked state. This information may be maintained without adding any additional data latches. Also, at least some of the data latches used during programming may be freed during the programming operation. Then, after programming is complete, the storage elements are read to determine which storage elements have a threshold voltage below a reference voltage level associated with the tracked state. However, those elements could include storage elements from any state below the tracked state, as well as under-programmed elements from the tracked state. By tracking which storage elements are in the tracked state, elements associated with other states may be filtered out such that an accurate assessment may be made as to which storage elements were under-programmed. From this information, a determination may be made whether the word line is defective. For example, if too many storage elements are under-programmed, this may indicate a broken word line. Further details are discussed below.

Figure 5D:
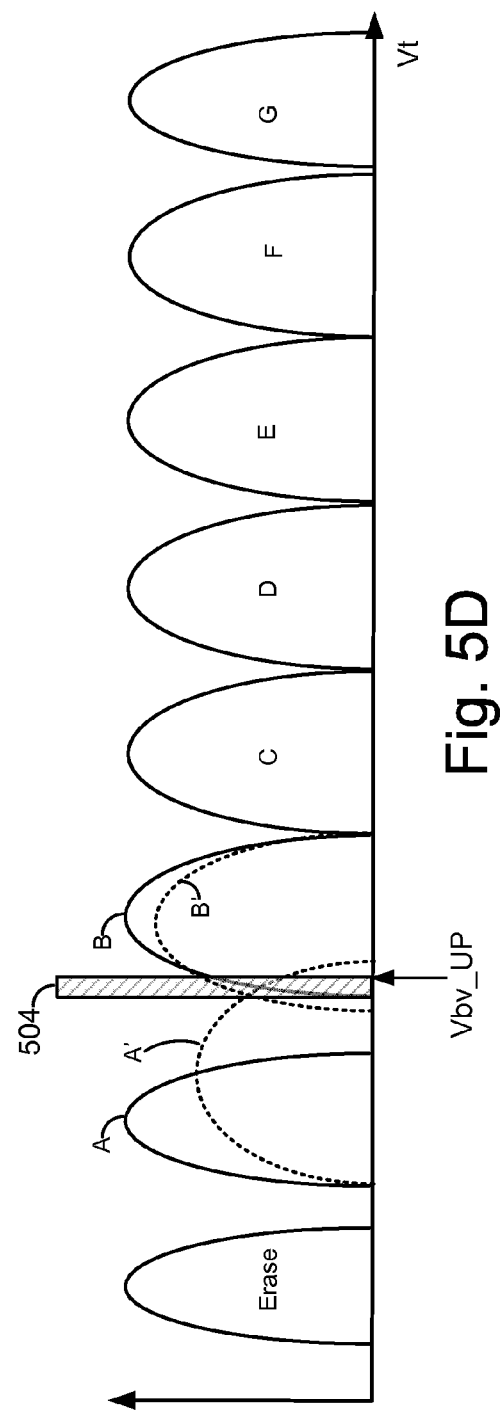
FIG. 5D illustrates that Vt distributions with a region for detecting mis-programmed cells, and a reference voltage used in one embodiment for detecting defects.

Another problem that may occur is A-state widening on a heavily cycled block. Even a word line without a break may show massive upper tail widening of the A-state for a heavily cycled block. This is depicted by the widened A' threshold distribution in FIG. 5D. However, note that a fresh (e.g., low cycled) block may not have nearly as much A-state widening.

Also note that memory cells that were intended to be programmed to the B-state may be under-programmed. The B' distribution represents that case with some under-programmed cells. One possible way to detect under-programmed B-state cells is to count the memory cells having a threshold voltage in region 504. However, this would count over-programmed A-state cells. An assumption might be made as to how many A-state cells are expected to be in region 504, such that the number of under-programmed B-state cells may be deduced from the total in region 504. However, the assumption of the number of A-state cells in region 504 may be inaccurate. As one example, for a fresh block the total number of cells in region 504 might not reach a failure criteria.

However, in one embodiment, a read is performed at Vbv_UP (e.g., an under-program reference voltage for the B-state). This counts all cells with a threshold voltage less than Vbv_UP. This may be performed during an erratic program detection after programming is complete. Note that B-state cells that are below region 504 will be counted. Moreover, the memory cells that were intended to be programmed to the B-state are tracked. Therefore, A-state (and erase state) cells can be subtracted from the initial count. Therefore, the under-programmed B-state cells can be accurately counted. Note that this may allow detection of word line defects even for a fresh block.

Figure 1A:
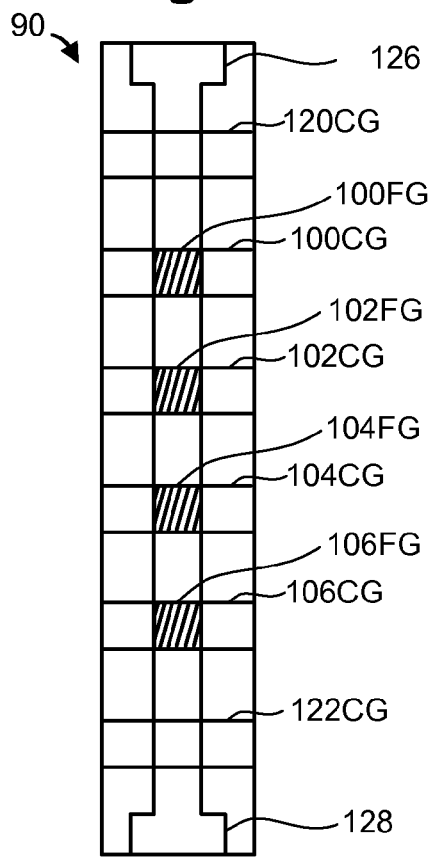
FIG. 1A is a top view of one embodiment of a NAND string.
Figure 1B:
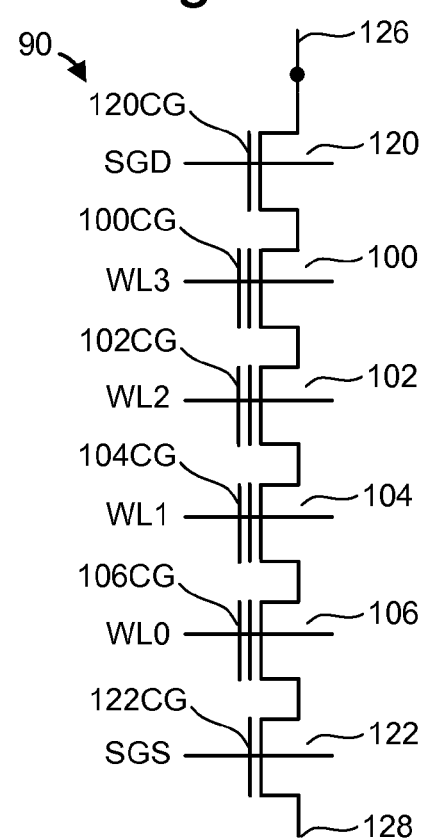
FIG. 1B is an equivalent circuit diagram of the NAND string.

One example of a suitable memory system for implementing embodiments uses the NAND flash memory structure, which arranges multiple transistors in series between two select gates. The transistors in series and the select gates are referred to as a NAND string. FIG. 1A is a top view showing one NAND string 90. FIG. 1B is an equivalent circuit thereof. The NAND string depicted includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gates 120 and 122 are controlled by applying the appropriate voltages to control gates 120CG and 122CG, respectively. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gates 100CG, 102CG, 104CG and 106CG are connected to word lines WL3, WL2, WL1 and WL0, respectively. In one embodiment, transistors 100, 102, 104 and 106 are each memory cells. In other embodiments, the memory cells may include multiple transistors or may be different than that depicted. Select gates 120 and 122 are connected to drain-side select line SGD and source-side select line SGS, respectively. Other types of non-volatile memory in addition to NAND flash memory can also be used.

Figure 2:
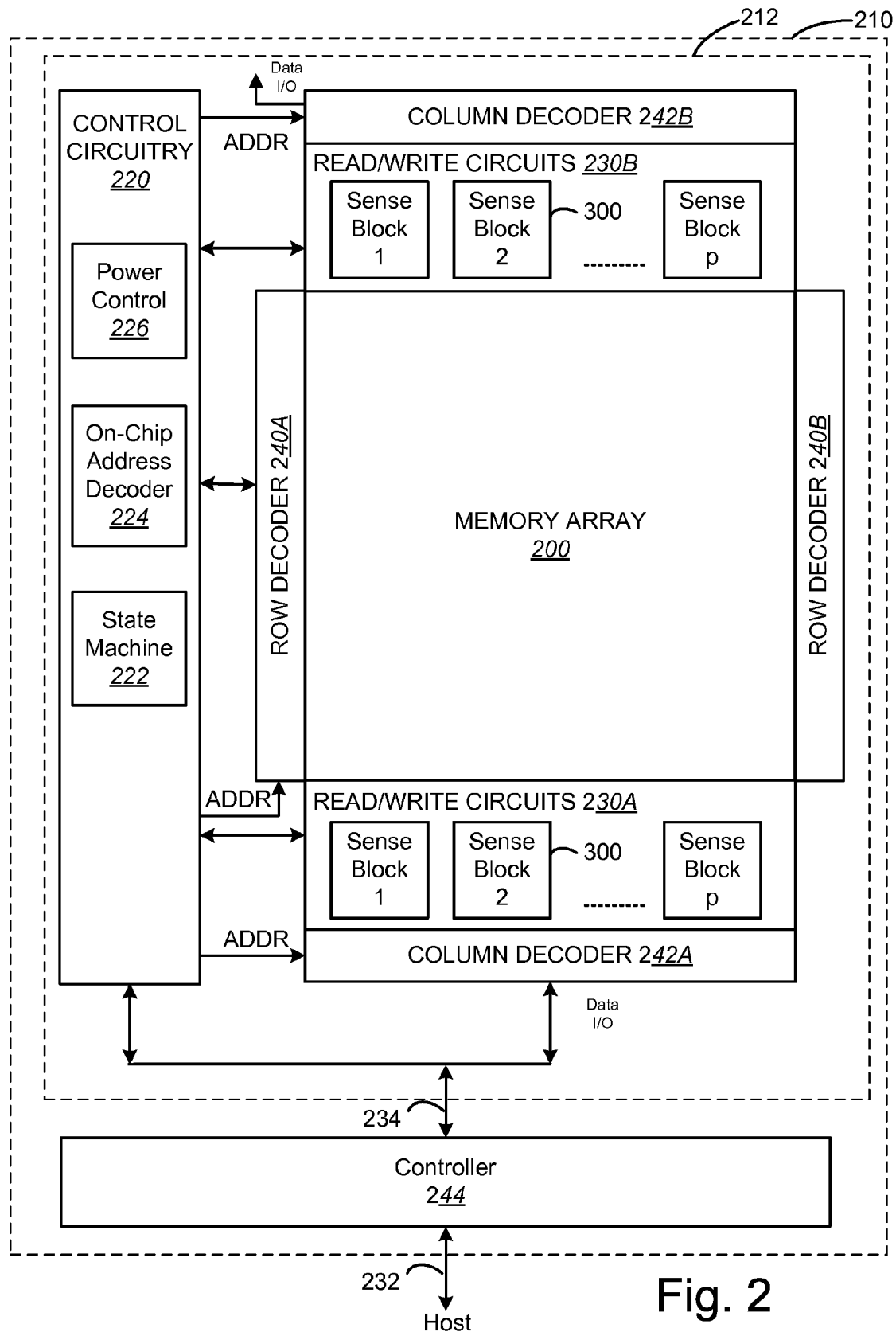
FIG. 2 illustrates a non-volatile storage device that may include one or more memory die or chips.

FIG. 2 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 3:
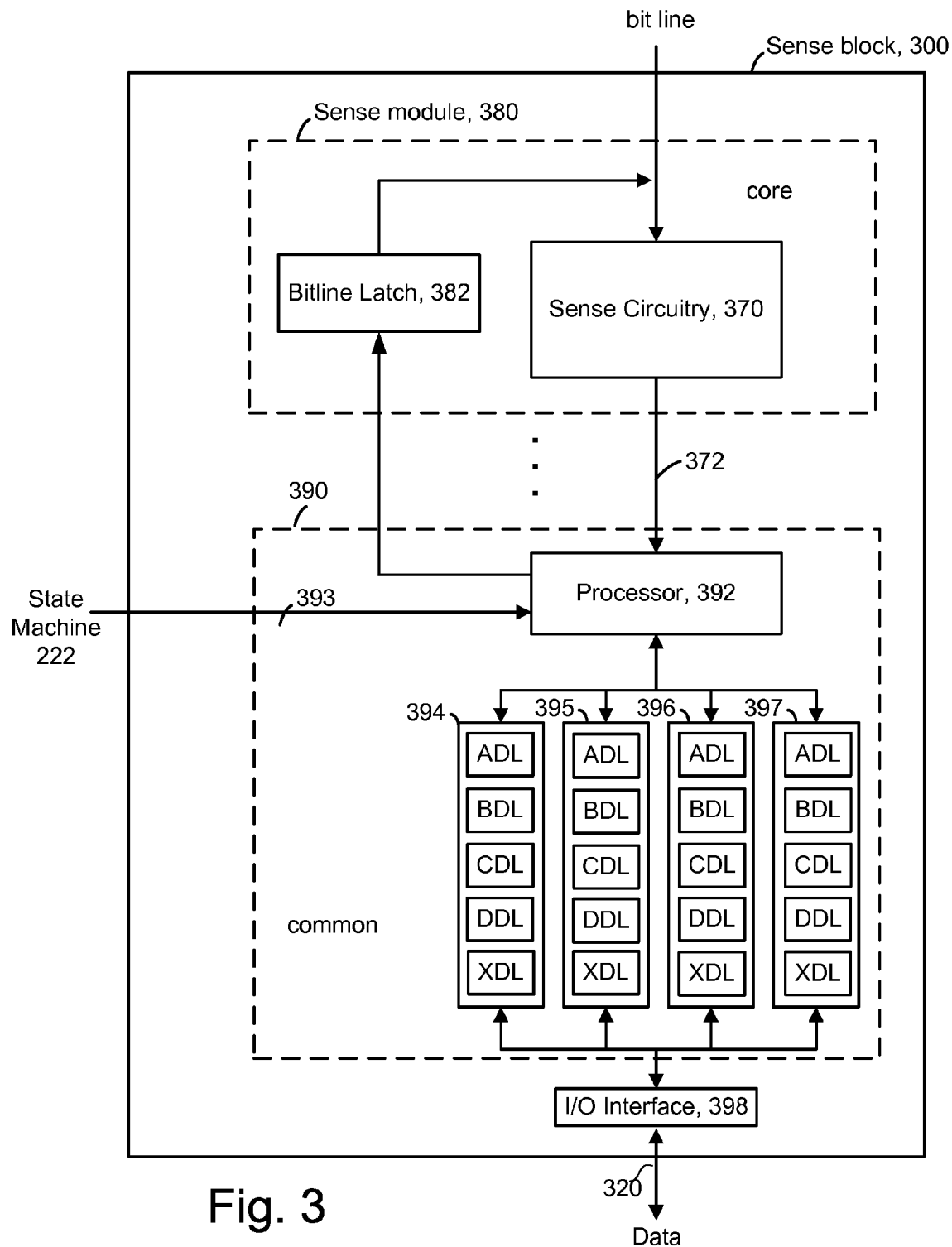
FIG. 3 is a block diagram depicting one embodiment of a sense block.

FIG. 3 is a block diagram depicting one embodiment of a sense block 300. An individual sense block 300 is partitioned into a core portion, referred to as a sense module 380, and a common portion 390. In one embodiment, there is a separate sense module 380 for each bit line and one common portion 390 for a set of multiple sense modules 380. In one example, a sense block 300 will include one common portion 390 and eight sense modules 380. Each of the sense modules in a group will communicate with the associated common portion via a data bus 372.

Sense module 380 comprises sense circuitry 370 that determines whether a conduction current in a connected bit line is above or below a predetermined threshold level. Sense module 380 also includes a bit line latch 382 that is used to set a voltage condition on the connected bit line. For example, a predetermined state latched in bit line latch 382 will result in the connected bit line being pulled to a state designating program inhibit (e.g., 1.5-3 V). As an example, a flag=0 can inhibit programming, while flag=1 does not inhibit programming.

Common portion 390 comprises a processor 392, five example sets of data latches 394 and an I/O Interface 398 coupled between the sets of data latches 394 and data bus 320. One set of data latches can be provide for each sense module, and five data latches identified by ADL, BDL, CDL, DDL, XDL may be provided for each set. The use of the data latches is further discussed below.

Processor 392 performs computations. For example, one of its functions is to determine the data stored in the sensed storage element and store the determined data in the set of data latches. At least some of the data latches in a set of data latches (e.g., 394) are used to store data bits determined by processor 392 during a read operation. At least some of the data latches in a set of data latches are also used to store data bits imported from the data bus 320 during a program operation. The imported data bits represent write data meant to be programmed into the memory. I/O interface 398 provides an interface between data latches 394-397 and the data bus 320.

In one embodiment, a user is able to stream data to be programmed into a storage element into the XDL latch. This program data may be transferred to the ADL, BDL, and CDL latches at the beginning of the program operation. Note this describes programming three bits per memory cell. In one embodiment, during a read operation, the ADL, BDL and CDL latch are used to store the three bits that are read from the memory cell. The user is able to toggle the read data out through the XDL latch in one embodiment.

In one embodiment, the user has access to the XDL latch, but not to the ADL, BDL, or CDL latches. For example, the user may be able to access the XDL latch to perform background caching during a program operation. Background caching is discussed in more detail below. In one embodiment, the user has limited access to the XDL during a program operation. For example, the user may be able to stream program data into the XDL latch prior to the programming operation. However, the user may not have access to the XDL latch during one embodiment of programming. In one embodiment, the XDL latch is used to store "lockout data" for the memory cell during a program operation. Briefly, the lockout data may indicate that a storage element is locked out from further programming. Further details are discussed below.

During reading or other sensing, the state machine 222 controls the supply of different control gate voltages to the addressed storage element. As it steps through the various control gate voltages corresponding to the various memory states supported by the memory, the sense module 380 may trip at one of these voltages and an output will be provided from sense module 380 to processor 392 via bus 372. At that point, processor 392 determines the resultant memory state by consideration of the tripping event(s) of the sense module and the information about the applied control gate voltage from the state machine via input lines 393. It then computes a binary encoding for the memory state and stores the resultant data bits into data latches (e.g., 394). In another embodiment of the core portion, bit line latch 382 serves both as a latch for latching the output of the sense module 380 and as a bit line latch as described above.

Some implementations can include multiple processors 392. In one embodiment, each processor 392 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 394-397 from the data bus 320. The program operation, under the control of the state machine, comprises a series of programming voltage pulses applied to the control gates of the addressed storage elements. Each program pulse is followed by a read back (verify) to determine if the storage element has been programmed to the desired memory state. Processor 392 monitors the read back memory state relative to the desired memory state. When the two are in agreement, the processor 392 sets the bit line latch 382 so as to cause the bit line to be pulled to a state designating program inhibit. This inhibits the storage element coupled to the bit line from further programming even if program pulses appear on its control gate. In other embodiments, the processor initially loads the bit line latch 382 and the sense circuitry sets it to an inhibit value during the verify process.

Each set of data latch stacks 394-397 contains a stack of data latches corresponding to the sense module 380, in one embodiment. In one embodiment, there are five data latches per sense module 380. The ADL, BDL, and CDL data latches can be implemented as a shift register so that the parallel data stored therein is converted to serial data in the XDL latch for transfer across data bus 320, and vice-versa. All the ADL, BDL, and CDL data latches corresponding to the read/write block of m storage elements can be linked together to form a block shift register so that a block of data can be input or output by serial transfer. In particular, the bank of read/write modules may be adapted so that each of its set of ADL, BDL, and CDL data latches will shift data in to or out of the XDL latch in sequence as if they are part of a shift register for the entire read/write block.

In one embodiment, one purpose of the ADL, BDL, and CDL latches is to store data that is to be programmed into a storage element. For example, the storage elements may store three bits per storage element. In one embodiment, the storage elements store four bits per storage element. In this case, there may be an additional data latch (not depicted in FIG. 3) for storing the fourth bit of data that is to be programmed into a storage element. In one embodiment, the storage elements store only two bits per storage element, in which case one of the ADL, BDL, and CDL latches is not needed. The storage elements could store more than four bits per storage element, in which case there may be one data latch for each bit.

In one embodiment, the ADL, BDL, and CDL latches may also be used to store status information during programming. For example, after the storage element has reached its target threshold voltage, each latch (ADL, BDL, CDL) could be set to "1" to indicate that programming is complete for this storage element. In one embodiment, the latches are used differently as programming proceeds to different stages. In one embodiment, the ADL latch is freed up during programming. In one embodiment, the BDL latch is also freed up during programming. Further details are discussed in connection with FIGS. 12, 13A-13D, and 14, and elsewhere.

In one embodiment, the DDL latch is used to store status information during programming. In one embodiment, programming is slowed as the storage element nears the target threshold level. For example, the DDL latch may identify that a storage element's Vth is above a lower verify level (e.g., VvaL or VvbL in FIG. 5A). If that storage element is not yet locked out, then it may receive slower programming. If the DDL latch indicates the storage element's Vth is below the lower verify level, then it may be in a fast programming mode. Further details are discussed below.

In one embodiment, the XDL latch is used to store status information during programming. After the data from the XDL latch has been shifted in to the ADL, BDL, and CDL data latches, the XDL latch may be set to an initial state (e.g., "0"). After a memory cell has reached its target threshold voltage, the XDL latch may be set to another state (e.g., "1"). Thus, the XDL latch may store "lockout status." Therefore, the program data in the ADL, BDL, and CDL latches may be preserved both during and after the program operation. Further details are discussed below.

FIG. 4 depicts blocks of NAND flash memory cells in the memory array 200 of FIG. 2. The memory array can include many blocks 400. Two example blocks 400 are depicted in FIG. 4. Each block 400 includes a number of NAND strings. A set of bit lines, e.g., BL0, BL1, ... may be shared among the blocks. Thus, each NAND string is associated with one bit line. Each NAND string is connected at one end to a drain select gate (SGD), and the control gates of the drain select gates are connected via a common SGD line. The NAND strings are connected at their other end to a source select gate which, in turn, is connected to a common source line 420. Sixty-four word lines, for example, WL0-WL63, extend between the source select gates and the drain select gates.

Other types of non-volatile memory in addition to NAND flash memory can also be used. For example, another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Note that there may be thousands, or tens of thousands of bit lines. Therefore, a single word line may be used by tens of thousands of storage elements. Typically, there is a driver at one and of the word line that provides the read reference voltages or the programming voltages.

FIG. 5A depicts an example set of threshold voltage distributions for an eight-state memory device in which each storage element stores three bits of data. A first threshold voltage (Vth) distribution is provided for erased (Er-state) storage elements. Seven Vth distributions represent programmed states A through G. In one embodiment, the threshold voltages in the Er-state are negative and the threshold voltages in the A-G distributions are positive. However, all or a part of the threshold distribution in the Er-state may be positive. Also, all or a part of the threshold distribution of the A-state may be negative (likewise for other data states).

Read reference voltages, Vra, Vrb, Vrc, etc. are also provided for reading data from storage elements. By testing whether the threshold voltage of a given storage element is above or below Vra, Vrb Vrc, etc. the system can determine the state, e.g., programming condition, the storage element is in.

Further, verify reference voltages, Vva, Vvb Vvc, etc. are provided. When programming storage elements to the A-state, B-state, C-state, etc. the system will test whether those storage elements have a threshold voltage greater than or equal to Vva, Vvb Vvc, etc.

In one embodiment, known as full sequence programming, storage elements can be programmed from the Er-state directly to any of the programmed states A-G. For example, a population of storage elements to be programmed may first be erased so that all storage elements in the population are in the Er-state. A series of program pulses will then be used to program storage elements into their respective target states A-G. While some storage elements are being programmed from the Er-state to the A-state, other storage elements are being programmed from the Er-state to the B-state, etc.

FIG. 5A also shows verify low reference voltages VvAL, VvBL, VvCL, etc. These reference voltages may be used during a program verify operation to determine whether a storage element is near its intended target threshold. If so, then programming speed may slow down. In one embodiment, Vdd is applied to bit lines that have reached their target state and are inhibited from further programming. Bit lines of storage elements that are still below the verify low level may be grounded to allow for fast programming. However, when between the verify low level and the normal verify level, the bit line may receive an intermediate voltage (e.g., between ground and Vdd) to cause slow or moderate speed programming. As one example, the intermediate voltage could be about 0.6V to 0.8V. However, the intermediate voltage could be either below or above this range. In one embodiment, the DDL latch indicates where the storage element is in this programming sequence. Further details are discussed below. In one embodiment, storage elements being programmed to the G-state do not receive the slow (or moderate) speed programming. Hence, no verify low reference voltage is depicted in FIG. 5A for the G-state. However, there may be a VvGL for the G-state, if desired.

In one embodiment, multiple passes may be used to program the storage elements. For example, one pass may be used to program each bit. Thus, in the case of storing three bits per memory cell, there may be three passes. In the case of storing two bits per memory cell, there may be two passes. In one embodiment, a multi-state storage element stores data for three different pages: a lower page, a middle page, and an upper page. The eight states, and the bits they represent, may be: Er-state (111), A-state (011), B-state (101), C-state (001), D-state (110), E-state (010), F-state (100), and G-state (000). For Er-state, all pages store a "1." For A-state, the lower page stores a "0", the middle page stores a "1" the upper page stores a "1." Other states can be deduced in a similar manner. Note that although specific bit patterns have been assigned to each of the states, different bit patterns may also be assigned. Also note that this bit and page assignment may be used for other programming sequences, such as the fast/slow programming described above.

In the first programming pass of one embodiment, the lower page is programmed for a selected word line WLn. If the lower page is to remain data 1, then the storage element state remains at the Erased state. If the data is to be programmed to 0, then the threshold voltage of the storage elements on WLn are raised such that the storage element is programmed to an intermediate state. This intermediate state could have a lower tail just below VvD. In the second programming pass of one embodiment, the middle page is programmed for a selected word line WLn. This results in the creation of two more threshold voltage distributions (one additional from each of the former distributions). In the third programming pass of one embodiment, the upper page is programmed for a selected word line WLn. This results in the creation of four more threshold voltage distributions (one additional from each of the former four distributions).

Although the programming examples depict eight data states and three pages of data, the concepts taught can be applied to other implementations with more or fewer than eight states and more or fewer than three pages. Moreover, in the example programming techniques discussed, the Vth of a storage element is raised gradually as it is programmed to a target data state. However, programming techniques can be used in which the Vth of a storage element is lowered gradually as it is programmed to a target data state. Programming techniques which measure storage element current can be used as well. The concepts herein can be adapted to the different programming techniques.

FIG. 5B illustrates that Vt distributions can partially overlap since the error correction algorithm can handle a certain percentage of cells that are in error. Note that in some embodiments, at one point in time the threshold voltage distribution may resemble FIG. 5A and at another time the threshold voltage distributions may overlap, as in FIG. 5B. For example, just after programming, the threshold voltage distribution may resemble FIG. 5A. However, over time, the threshold voltages of memory cells may shift, such that there may be overlap.

However, there may be overlap between at least some neighboring threshold distributions immediately after programming. Note that it can be very difficult to detect word line defects when there is overlap between neighboring Vt thresholds.

Also note that contrary to the equal spacing/width of the depicted threshold voltage distributions, various distributions may have different widths/spacings in order to accommodate varying amounts of susceptibility to data retention loss.

Figure 6A:
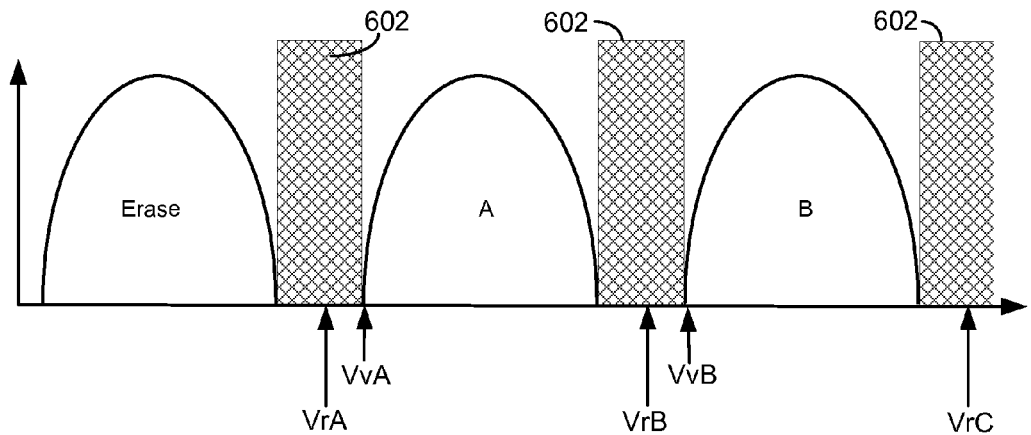
FIG. 6A depicts several Vt distributions to illustrate reference voltages in accordance with one embodiment.

FIG. 6A depicts several Vt distributions to further illustrate reference voltages in accordance with one embodiment. Only the erase, A-, and B-state are depicted. It will be understood that there are more states. For example, there may be eight states, as depicted in FIG. 5A. Each data state is budgeted a range of threshold voltage, as indicated by the width of each individual Vt distribution.

A forbidden region 602 may be defined between the upper tail of a distribution and the verify reference level of the next highest state. In one embodiment, any storage element having a threshold voltage in the forbidden region may be classified as a type of error. For example, storage elements in the forbidden region 602 may be classified as either over-programmed, or under-programmed. Note that over- and under-programmed may be defined differently from this example. Also note that a forbidden region 602 is not required to be at the exact location as in this example.

Figure 6B:
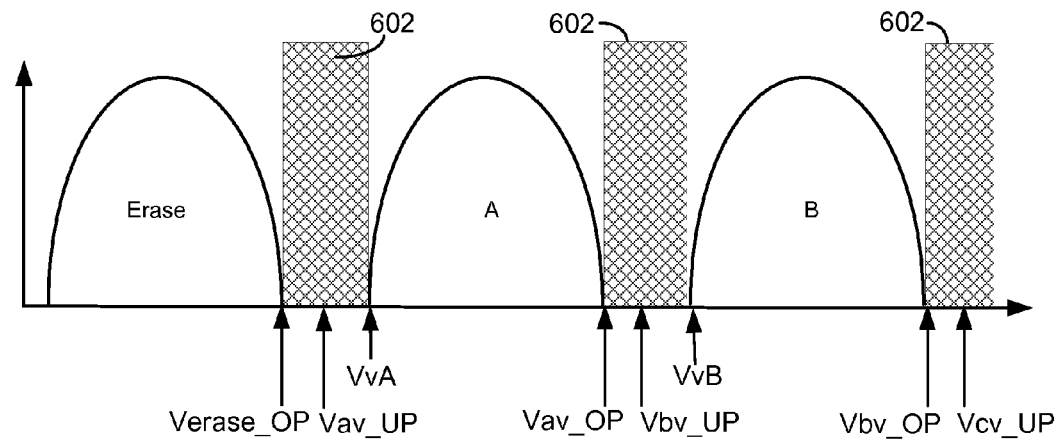
FIG. 6B depicts several Vt distributions to illustrate under- and over-program reference voltages in accordance with one embodiment.

FIG. 6B shows over-programmed reference voltages, as well as under-programmed reference voltages, in accordance with one embodiment. The over-programmed reference voltages may be at or lower than the lower boundary of one of the forbidden regions 602, in this embodiment. For example, Verase_OP may be at or below the lower boundary of the forbidden region 602 just above the erased state. Thus, storage elements that were intended to be in the erased state, but that have a Vt above Verase_OP may be classified as over-programmed. Likewise, storage elements that were intended to be in the A-state, but that have a Vt above Vav_OP may be classified as over-programmed. Note that FIG. 6B depicts just one possible location for the over-programmed reference voltages.

The under-programmed reference voltages may be lower than or equal to the verify reference voltage for their respective state, in this embodiment. For example, Vav_UP may be equal to or lower than VvA. Thus, storage elements that were intended to be in the A-state, but that have a Vt below Vav_UP may be classified as under-programmed. Likewise, storage elements that were intended to be in the B-state, but that have a Vt below Vbv_OP may be classified as under-programmed. Note that FIG. 6B depicts just one possible location for the under-programmed reference voltages. Finally, please note that FIG. 6B does not depict any representative under-programmed or over-programmed storage elements.

As noted above, it is possible for word line defects to exist. Such defects may be present when the memory device is manufactured, or may develop over time. One example of a word line defect is referred to as a "broken" word line. A "broken word line" is one in which the resistance is higher than normal at some point along the word line. For a broken word line, the resistance higher than normal resistance may cause memory cells to fail to program properly; however, this may not show up during programming as a program defect. Note that if the resistance is extremely high, it might get detected during programming due to a programming defect. Embodiments disclosed herein are able to detect cases in which the resistance is higher than normal (such that it causes under-programmed cells), even though the resistance is not high enough such that it is detected during programming as an error. Embodiments disclosed herein detect broken word lines and other defects after programming has completed. Note that typically the voltage on the word line is able to pass through the break to at least some extent. However, the signal may be impaired at the break. One possible reason for this impairment is due to the RC constant being higher at the break.

Figure 7:
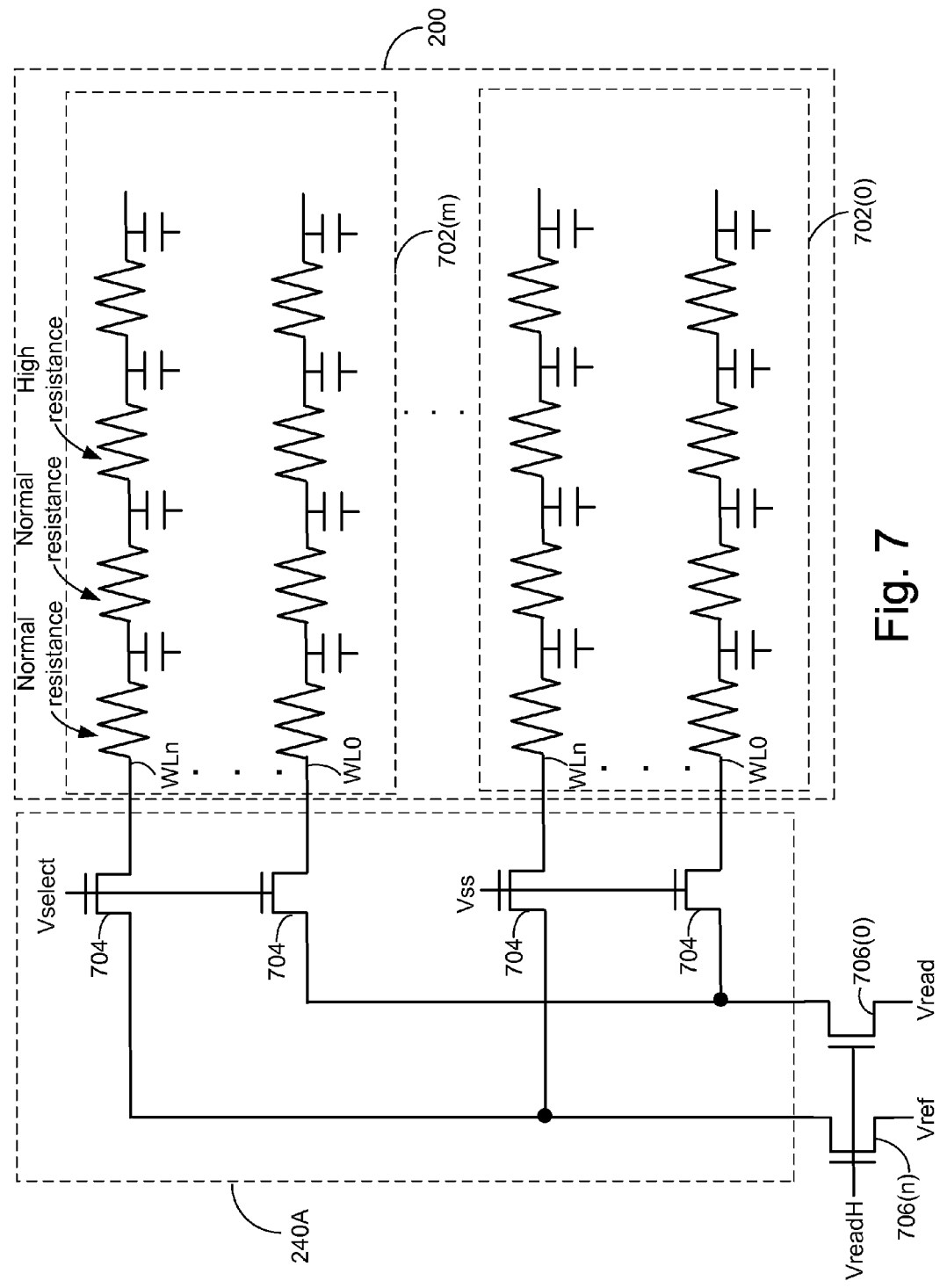
FIG. 7 depicts a schematic diagram of a portion of one embodiment of a memory array.

FIG. 7 depicts a schematic diagram of a portion of one embodiment of a memory array 200. FIG. 7 provides more details of one embodiment of the memory array 200 and associated row decoders 240A. The memory array has blocks 702(0)-702(m). Two blocks are depicted in FIG. 7, although there typically may be many more blocks 702. The word lines (WL0 ... WLn) in a block 702 are modeled as having some resistance and some capacitance. The row decoders 240A include a block select transistor connected 704 to each word line. The voltage Vselect is applied to each block select transistor 704 in block 702(n) to select that block 702(n). The voltage Vss is applied to each block select transistor 704 in other blocks (e.g., block 702(0)), such that that other blocks are un-selected. Typically, there is one selected block and many unselected blocks. There may be one word line voltage transistor 706(0)-706(n) coupled to each word line. For example, transistor 706(0) is coupled to WL0 of each block 702 through one of the word line select transistors 704. Likewise, transistor 706(n) is coupled to WLn of each block 702 through one of the word line select transistors 704. Note that a given word line voltage transistor 706 may be shared by different blocks. For example, if there are 64 word lines per block, there may be 64 word line voltage transistors 706.

Suitable voltages for a read or verify operation are being applied. A reference voltage (Vref) is applied to word line voltage transistor 706(n). The reference voltage may be a verify reference voltage, read reference voltage, etc. Vread is applied to word line voltage transistor 706(0). The voltage Vread may also be applied to other word line voltage transistors (not depicted in FIG. 7) in order to apply Vread to other un-selected word lines of the selected block 702(m). Because Vss is applied to the block select transistors 704 in the non-selected blocks, the voltages Vref and Vread do not pass to the word lines in the un-selected blocks. Note that other configurations could be used to provide the voltages to the word lines.

Because there is some resistance and some capacitance associated with the word lines (both selected and un-selected), the voltages that are applied to the word lines take some time to propagate to the far end of the word lines. Note that a word line may have many memory cells associated with it. For example, there may be thousands, tens of thousands or even more memory cells associated with a single word line. In some cases, bit lines of memory cells along the entire word line may be sensed during a sensing operation. For example, all memory cells on a word line might be sensed together, or every other memory cell might be sensed together. Even if fewer memory cells are being sensed, the selected word line voltage should be at its target reference voltage level before sensing the selected memory cell.

If the pulse width of the read reference voltage is long enough, relative to the RC time constant along the selected word line, then the reference voltage should be able to ramp up to its intended value at both the near and far ends of the selected word line. However, if there is a high resistance portion of the selected word line (e.g., a "break"), then the RC time constant may be so high that the reference voltage cannot ramp up to its intended value. Therefore, storage elements on the far side of the break (relative to the drive transistors 704) may receive a lower reference voltage than intended. Therefore, results of the read of verify cannot be trusted. Note that this may cause some storage elements to be under-programmed in that they may pass a program verify even though their Vt is below its target level.

Note that in some embodiments, the resistance of the control lines outside of the memory array 200 may be lower than the resistance of the word lines. Also, the control lines may, in some cases, be spaced further apart than word lines in the memory array 200 are spaced. Therefore, capacitive coupling between control lines outside the memory array 200 may be less than for word lines. Due to this lower resistance and/or the lower capacitive coupling, the RC time constant for the control lines may be lower than that of the word lines. Thus, the signal propagation delay along the control lines may be less of a problem than the delay along word lines.

Figure 8:
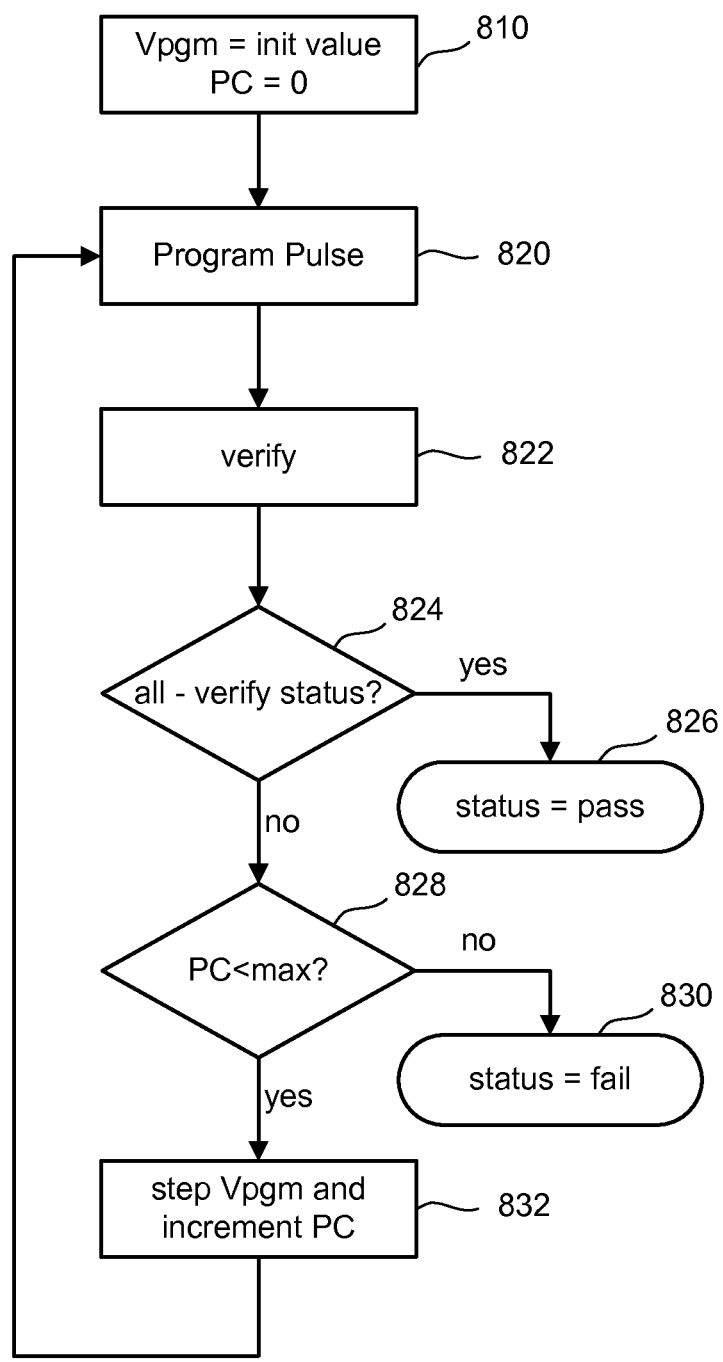
FIG. 8 is a flowchart describing one embodiment of a programming process, which includes one or more verification steps.

FIG. 8 is a flowchart describing one embodiment of a programming process, which includes one or more verification steps. In step 810, the program voltage (Vpgm) is set to an initial value. Also, in step 810, a program counter (PC) is initialized to zero. In step 820, a program pulse is applied.

In step 822, a verification process is performed. In one embodiment, the verification is a concurrent coarse/fine verify. Referring to FIG. 5A, some memory cells that are being programmed to the A-state are verified for the VvaL level, while others that are being programmed to the A-state are verified for the Vva level. During the initial programming steps in which the memory cell's threshold is well below the final level (Vva), course programming is applied. However, after the memory cell's threshold voltage reaches VvaL, fine programming is used. Thus, while some memory cells are being verified for coarse programming, other memory cells are being verified for fine programming. Note that with course/fine programming, some memory cells are being verified for one state (e.g., A-state), while others are being verified for another state (e.g., B-state). Note that when a particular memory cell has been verified as being programmed to its intended state, it may be locked out from further programming.

However, note that if there is a break on the selected word line being programmed, then the verification may produce an erroneous result. As noted above, a break in the word line could result in storage elements on the far side of the break receiving a reference voltage that is smaller than intended. For example, storage elements that are intended to be programmed to the G-state should receive the reference voltage VvG (see FIG. 5A) at their control gate. However, they may in fact receive a lower voltage due to the break. Under normal circumstances, if a storage element has not yet reached its target state (e.g., its actual Vt is below the reference voltage), the storage element will turn on in response to the verify voltage. On the other hand, if a storage element has reached its target state (e.g., its actual Vt is at or above the reference voltage) it should not turn on. For example, consider the case of a storage element being targeted for the G-state. This storage element will be verified by applying VvG to the selected word line. If its actual Vt is below VvG it will conduct a current. After its actual Vt is above VvG it will no longer turn on, indicating it has reached its target state.

However, since storage elements beyond the break receive too low of a verify voltage, they may fail to turn on when their actual Vt is below the target Vt. A storage element past the break might see a lower verify voltage than intended. For example, a storage element that is targeted for the G-state might should see a verify voltage of VvG, but might experience a lower voltage at its control gate. As one particular example, the storage example might only see a verify voltage of VvF, if it is past the break. Therefore, in this particular example, when its actual Vt is greater than VvF it will pass the verify test. In general, the storage element past the break could pass the verify test if its actual threshold voltage is below VvG. Therefore, programming will stop for that storage element. However, it may in fact be under-programmed.

In step 824, it is determined whether all of the memory cells have verified that their threshold voltages are at the final target voltage for that memory cell. If so, the programming process is completed successfully (status=pass) in step 826. If all of the memory cells are not all verified, then it is determined whether the program counter (PC) is less than a maximum value such as 20. If the program counter (PC) is not less than max (step 828), then the program process has failed (step 830). If the program counter (PC) is less than a maximum value (e.g., 20), then the program counter (PC) is incremented by 1 and the program voltage is stepped up to the next pulse in step 832. Subsequent to step 832, the process loops back to step 820 and the next program pulse is applied to the memory cells.

Figure 9A:
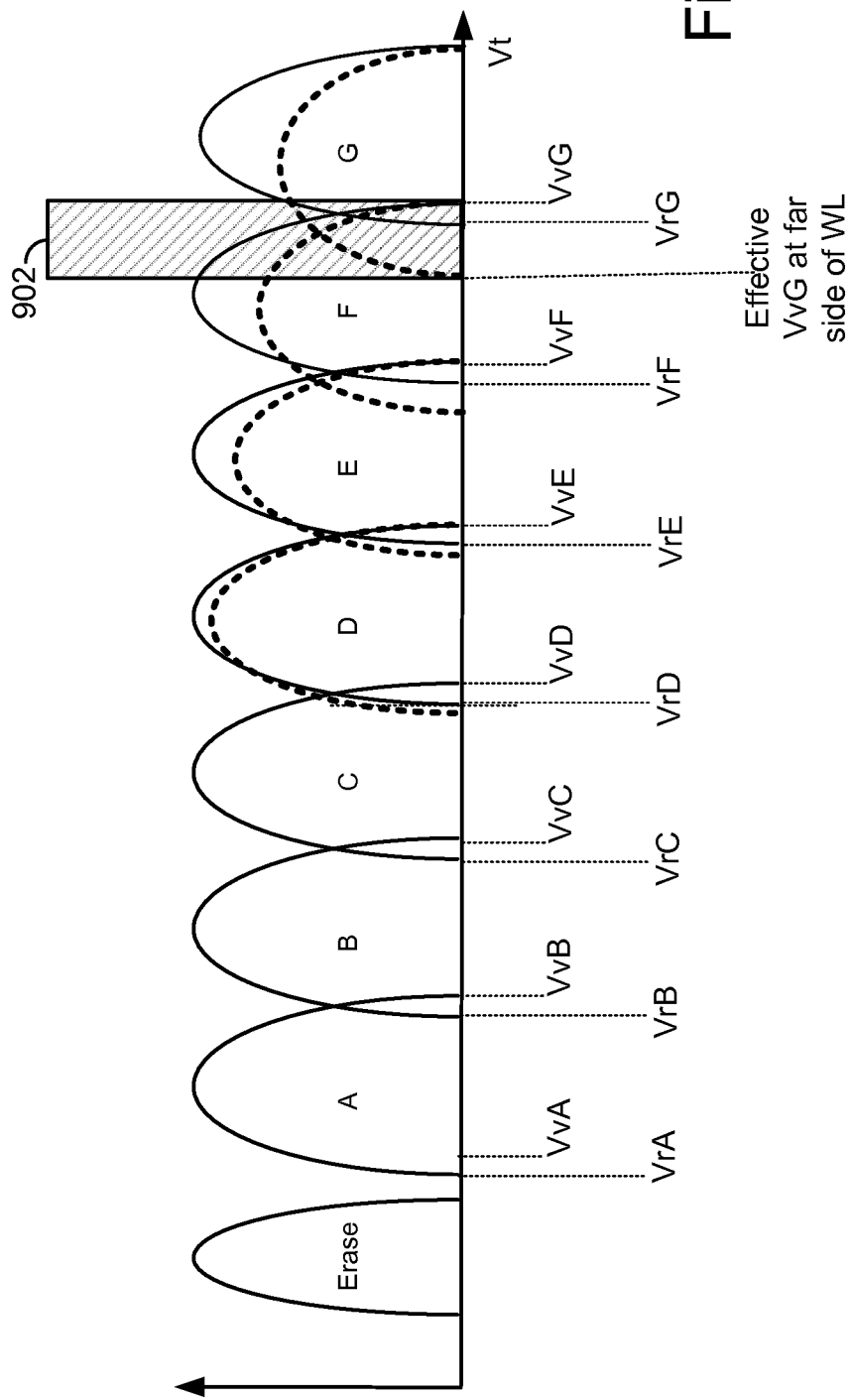
FIG. 9A depicts threshold voltage distributions to help illustrate a possible word line defect that may show up as under-programmed states.

FIG. 9A depicts threshold voltage distributions to help illustrate a possible word line defect. The solid line represents desired threshold voltage distributions for each state. The dashed lines for states D-G represent possible threshold voltages if the word line has a defect, such as a break. As was noted during description of the programming operation (see FIG. 8), storage elements could be under-programmed if there is a word line break. Specifically, those storage elements beyond the break might be under-programmed. However, storage elements that are between the word line drive and the break should not be affected by the break. This is depicted in FIG. 9A by some storage elements being under-programmed. Of course, the location of the break (e.g., how near it is to the word line driver) may impact how much under-programming occurs. In one possible scenario, the G-state may experience more under-programming than the F-state, which experience more than the E-state, etc. However, other scenarios are possible.

In FIG. 9A, the under-programmed storage elements for the G-state are represented by region 902. The under-programmed region lies between the effective verify voltage at the far end of the selected word line and the VvG that was applied to the selected word line. Note that the effective VvG at the far end of the word line may be a function of the RC time constant due to the break and the shape (e.g., duration) of the verify pulse. Similar under-programmed regions are not depicted for other states, so as to not obscure the diagram. However, such regions could be defined.

Figure 9B:
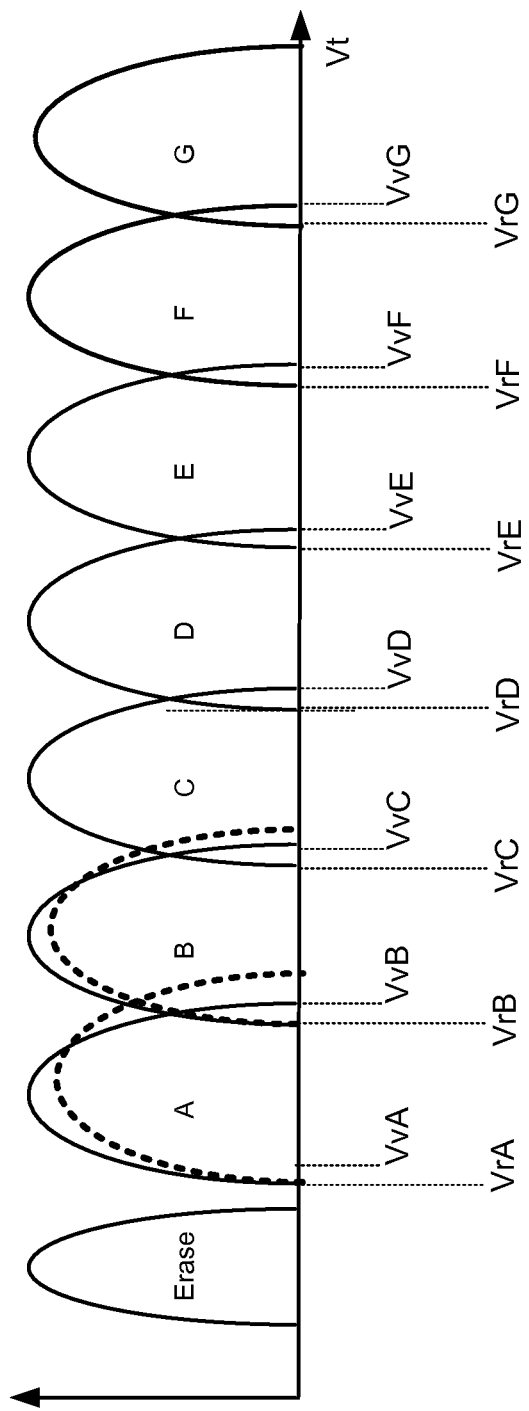
FIG. 9B depicts threshold voltage distributions to help illustrate a possible word line defect that may show up as over-programmed states.

Note that it is also possible for some states to have memory cells that are over-programmed, as a result of a defect such as a broken word line. As one example, some memory cells in the A-state, B-state, etc. might be over-programmed. FIG. 9B depicts a case in which lower states are over-programmed due to a defective word line. In this example, the A-state and B-state are over-programmed. However, other states may be affected, as well. In one embodiment, a broken word line is detected during an erratic program process by looking for over-programmed memory cells in lower states.

A possible cause for this is coupling between adjacent word lines and/or signals running above the word line and the far end of the broken word line. For example, during program verify the far end of broken word line could be floating (at least to some extent), if the resistance is high enough at the break. If the far end of a selected word line is floating, its voltage level could be significantly affected by its neighbors. As one example, this could cause the A-state verify voltage VvA to shift to the right, as compared to the correct level depicted in FIG. 9B. When verifying, a voltage Vread is typically applied to unselected neighbor word lines. As one example, Vread could be around 6-7 volts and an A verify voltage around 0V. Therefore, the voltage at the far end of a broken word line could be higher than intended, especially when verifying lower voltage states. Note that the voltage at the far end of the broken word line may settle down after some period of time. However, it might not settle down in time prior to sensing the bit lines.

Figure 10:
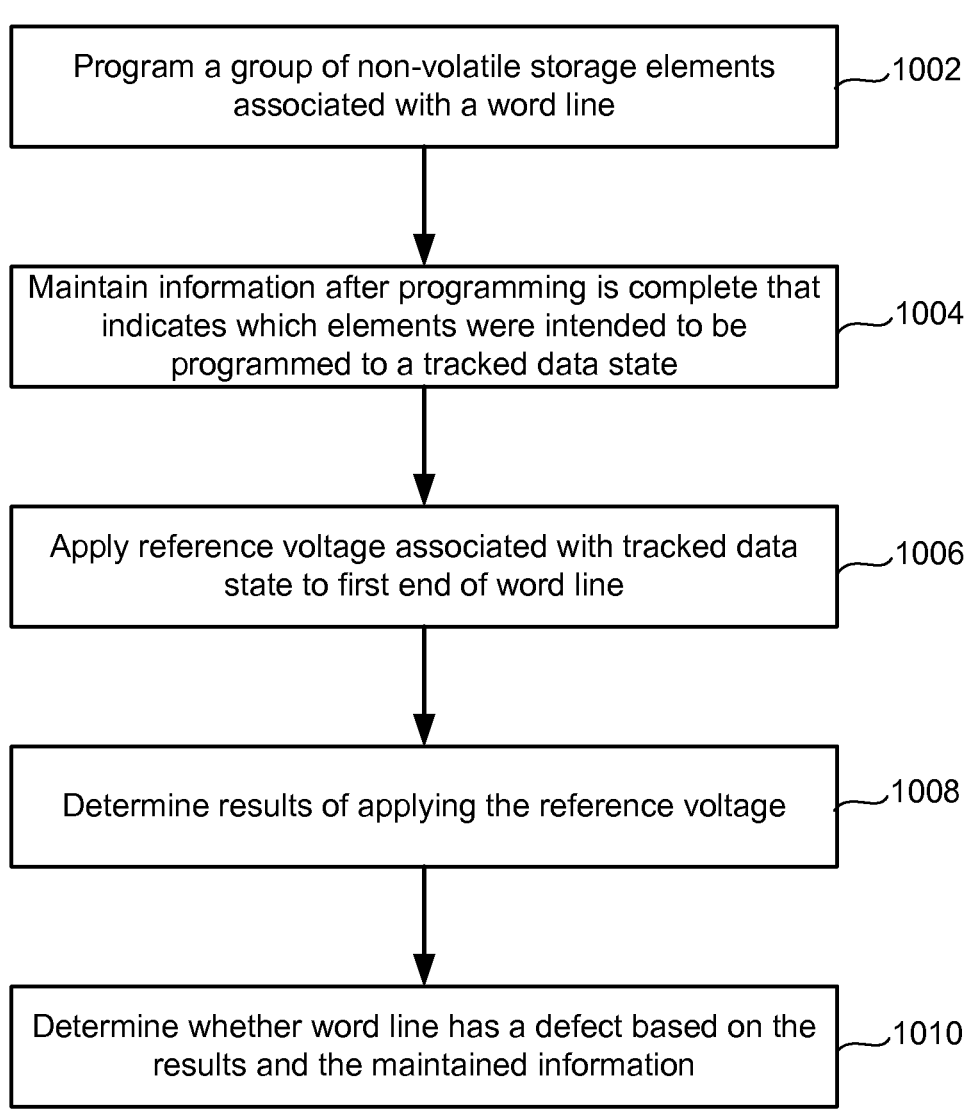
FIG. 10 is a flowchart of one embodiment of a process of determining whether a word line is defective following programming of non-volatile storage.

FIG. 10 is a flowchart of one embodiment of a process 1000 of determining whether a word line is defective following programming of non-volatile storage. In one embodiment, process 1000 determines whether the word line is broken (e.g., has an abnormally high resistance portion).

Step 1002 is programming non-volatile storage elements associated with a selected word line. FIG. 8 shows one embodiment of programming non-volatile storage. In one embodiment, when performing the verify operations the width of the voltage pulses has a first duration. This first duration may not be sufficient to allow the verify voltage to fully develop at the end of the selected word line past a break (if a break exists). Therefore, it is possible that storage elements that are past the break could be under-programmed. It is also possible that the first duration may not be long enough for the voltage at the far end to settle down to the correct verify voltage in the event its voltage is coupled up by neighbor word lines (especially for lower voltage states). Therefore, it is possible that storage elements that are past the break could be over-programmed.

Note that steps 1004-1010 may be performed after a programming operation. Step 1004 is to maintain information after the programming operation is complete that indicates which elements were intended to be programmed to a tracked data state. Any of the data states may be tracked. In one embodiment, one of the data latches (e.g., 394-397) that was used during programming is used to maintain this information. Further details are discussed below. Note that at least some of the data latches may be freed up during programming, in one embodiment. Therefore, these free latches may be used for other purposes.

Step 1006, a reference voltage that is associated with the tracked data state is applied to the selected word line. This reference voltage might have the same magnitude as the verify reference voltage for the tracked state. However, that is not required. In one embodiment, the reference voltage of step 1006 is an under-program voltage for the tracked state. The under-program voltage may be equal to or less than the verify voltage. Examples were discussed with respect to FIG. 6B. For example, the voltage Vbv_UP might be used if the B-state is the first state in question.

In one embodiment, the reference voltage in step 1006 has a longer duration than the verify voltages used during programming. The reference voltage may be long enough to increase the probability that the applied reference voltage will reach the storage elements past a break in the word line. However, it may not be possible to guarantee that the reference voltage will in fact reach the storage elements past the break. For example, if the RC time constant is too high, then a pulse of reasonable duration may not reach the steady state value at the end of the word line. However, in this case it is likely that the program operation fails, in one embodiment. That is, if the RC time constant is too high, then the program operation of one embodiment fails.

The reference voltage of step 1006 may be long enough to increase the probability that far end of the word line will settle down to the intended reference voltage. However, it may not be possible to guarantee that the far end will settle down to the intended reference voltage. However, in this case it is likely that the program operation fails, in one embodiment.

In step 1008, results of applying the reference voltage are determined. For example, the results indicate which storage elements have a threshold voltage greater than the reference voltage. Note that applying the reference voltage may cause the selected storage element to turn on and have a "conduction current." There are numerous ways to perform step 1008. In one embodiment, the conduction current (if any) of the storage element cell is measured to determine whether the storage element turned on in response to the voltage applied to the word line. If the conduction current is measured to be greater than a certain value, then it is assumed that the storage element turned on and the voltage applied to the word line is greater than the threshold voltage of the storage element. If the conduction current is not measured to be greater than the certain value, then it is assumed that the storage element did not turn on and the voltage applied to the word line is not greater than the threshold voltage of the storage element.

In one embodiment, the conduction current of a storage element is measured by the rate it discharges a dedicated capacitor in the sense amplifier. In one embodiment, the conduction current of the selected storage element allows (or fails to allow) the NAND string that included the storage element to discharge the bit line. The charge on the bit line is measured after a period of time to see whether it has been discharged or not.

In step 1010, a determination is made whether the word line has a defect based on the results from step 1008 and the maintained information. In one embodiment, step 1010 includes determining whether the non-volatile storage elements that were both intended to be programmed to the first data state and conducted a current in response to the first reference voltage is greater than a threshold number of the non-volatile storage elements.

For example, referring to FIG. 9, step 1010 may determine which storage elements were intended to be programmed to the G-state (based on the maintained information), but have a threshold voltage below VvG (note that a different reference voltage maybe used). In effect, one embodiment of step 1010 may determine which storage elements are in region 902.

Two aspects are to be noted. First, note that storage elements that were intended to be programmed to the any state but the G-state are not included in the count of step 1010. Second, only a single read (at step 1006) is needed. Performing only a single read saves time. This is in contrast with techniques that need to read at at least two points to count how many total cells are in a region such as region 902. Note that if two reads were to be performed at say, Vfv_OP and Vgv_UP, then a count could be made of how many cells are in this region. However, because there may be overlap between the F-state and G-state, it may not be possible to tell how many of those cells are F-state and how many are G-state. Thus, such techniques may not be able to accurately determine how many G-state memory cells were under-programmed. Moreover, referring to FIG. 9, there may be a substantial number of under-programmed G-state cells having threshold voltages between the effective VvG at the far side of the word line and VvG. However, the effective VvG could be any value, and is unlikely to correspond to Vfv_OP. Therefore, reading at Vfv_OP and Vgv_UP is not likely to count G-state cells in region 902.

In one embodiment, step 1010 determines which memory cells that were intended to be programmed to the A-state were over-programmed. In this case, an over-program reference voltage (e.g., Vav_OP, FIG. 6B) may be used as a reference voltage. The tracked state may be the A-state in this example.

Figure 11:
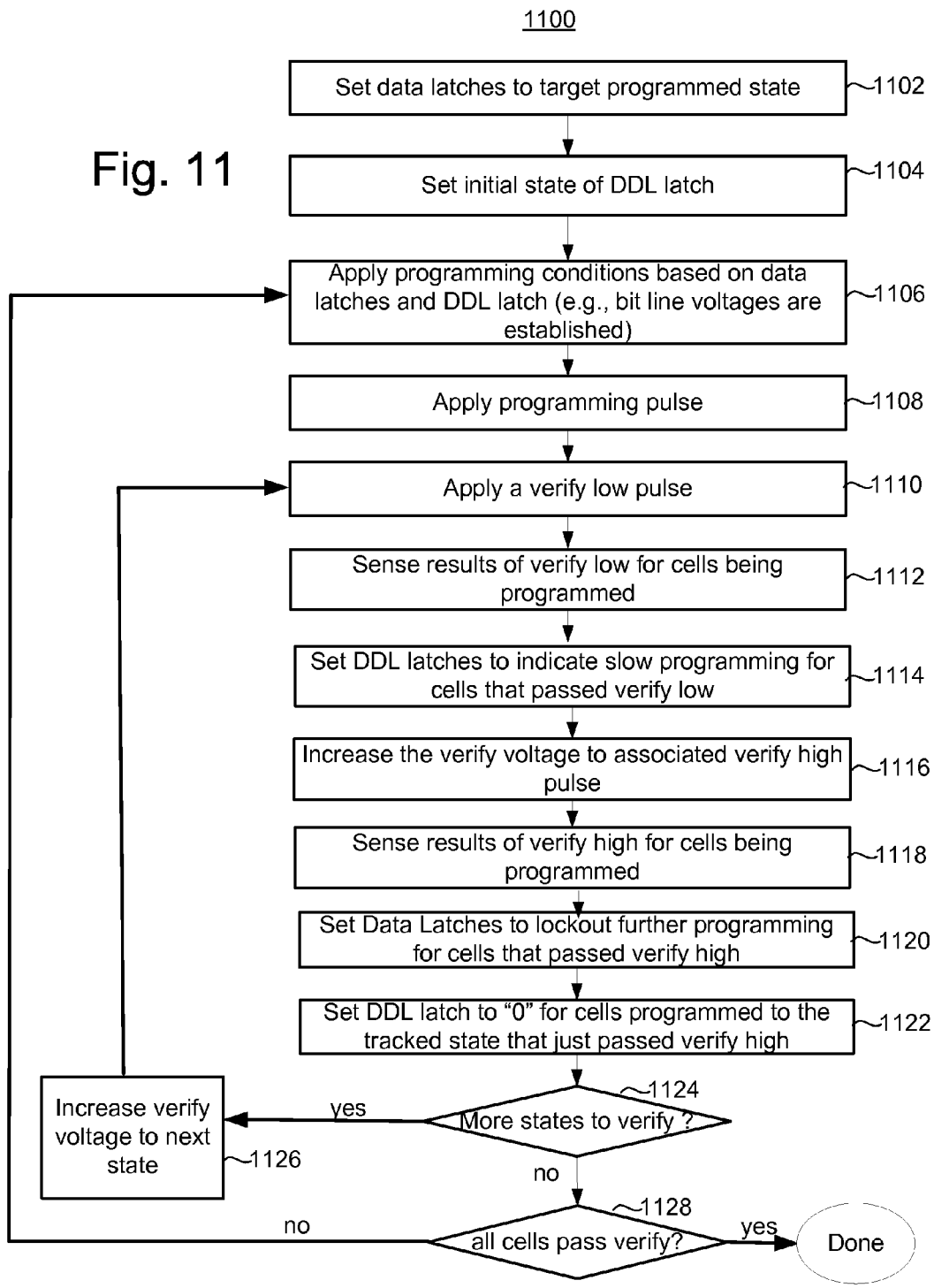
FIG. 11 is a flowchart of one embodiment of a process of operating data latches while programming and verifying non-volatile storage.

FIG. 11 is a flowchart of one embodiment of a process 1100 of operating data latches while programming and verifying non-volatile storage. Process 1100 provides details of maintaining information that indicates which storage elements were programmed to a particular state. Note that data latches that initially indicate which state that a storage element is to be programmed to may be freed up during programming. Therefore, this information may be lost during the programming process. In one embodiment, the process 1100 "tracks"

or maintains information for one state. By tracking a state, it is meant that the process 1100 maintains information after the programming is over as to which storage elements were intended to be programmed to a particular (tracked) state. Note that this may be the erased state, as well as any of the programmed states.

Process 1100 provides further details of one embodiment of steps 1002 and 1004 from FIG. 10. Reference will be made to a set of data latches 394 in FIG. 3. As noted above, three data latches ADL, BDL, and CDL initially store the data to be programmed into the storage element. Thus, the storage element stores three bits, in one embodiment. The fourth data latch, DDL, is used for what is referred to herein as "quick pass write" (QPW) status. Note that there could be more or fewer than four latches.

In step 1102, data latches are set to their target program state. In one embodiment, ADL, BDL, and CDL latches are set as indicated in FIG. 13A. Note that a different bit assignment may be used.

In step 1104, the DDL latch is set to an initial state. In one embodiment, the DDL latch is set as indicated in FIG. 13A. In that embodiment, the DDL latch for all storage elements is set to "0" except for those that are to remain in the erase-state. In one embodiment, every DDL latch is set to "0". In one embodiment, setting the DDL latch for all states to "0" is used when tracking the erased state.

In step 1106, programming conditions are applied based at least in part on the data latches. In one embodiment, bit line voltages are set. In one embodiment, three categories are used. One for storage elements that are locked out (or inhibited) from any further programming, one is for storage elements that are still undergoing fast programming, and one is for storage elements that are to receive slower programming because they are near their target threshold voltages.

In one embodiment, bit lines for storage elements locked out or inhibited storage elements are set to Vdd, bit lines for storage elements undergoing nominal (or fast) programming are set to ground (e.g., Vss), bit lines for the third category are set to an intermediate voltage between ground and Vdd. This intermediate voltage slows down the programming to some extent.

In step 1108, one or more programming pulses are applied to the selected word line. A pass voltage (e.g., Vpass) may be applied to unselected word lines.

In step 1110, a verify low pulse is applied to the selected word line. Referring to FIG. 5A, VvAL may be applied. In step 1112, sensing is performed to determine whether storage elements that were intended to be programmed to the state associated with the verify low pulse have reached the verify low point. For example, storage elements intended to be programmed to the A-state (as indicated in ADL, BDL, CDL) are sensed to determine whether their threshold voltage is at or above VvAL. In one embodiment, the current of the bit line is sensed.

In step 1114, the DDL latches are set based on the results of step 1112. Note that the DDL latches in question are those associated with the state that was just verified. In one embodiment, the DDL latch is set to "1" to indicate that slow programming is to be performed. For example, storage elements intended to be programmed to the A-state that have a threshold voltage above VvAL have their DDL latch set to "1".

In step 1116, the verify reference voltage is increased to the associated verify high reference voltage for the present state being verified. For example, the reference voltage is set to VvA (see, FIG. 5A). In one embodiment, step 1116 involves increasing the voltage on the selected word line.

In step 1118, sensing is performed to determine whether storage elements that were intended to be programmed to the state associated with the nominal verify pulse have reached the nominal verify point. For example, storage elements intended to be programmed to the A-state are sensed to determine whether their threshold voltage is at or above VvA. In one embodiment, the current of the bit line is sensed.

In step 1120, the ADL, BDL, and CDL latches are set based on the results of step 1120. Note that the latches in question are those associated with the state that was just verified. In one embodiment, one or more of the ADL, BDL, and CDL latches are set to "1" to indicate that programming is to be inhibited. For example, storage elements intended to be programmed to the A-state that have a threshold voltage above VvA have their ADL, BDL, and CDL latches set to "1".

Under some conditions only one or two of the data latches may be needed to indicate the lockout conditions. Thus, step 1120 includes setting one or more of latches ADL, BDL, and CDL to "1", in one embodiment. In one embodiment, the process 1100 keeps track of how far along the programming process is, and uses a different set of latches to indicate lockout depending on which stage programming is in. Further details are discussed below.

In step 1122, the DDL latch of storage elements being tracked may be set to "0", if they just passed program verify. For example, if the A-state is the being tracked, then the DDL latch of those storage elements that just passed program verify for the A-state have their DDL latch set to "0". However, if a state other than the A-state is being tracked (e.g., the A-state is not being tracked), then the DDL latch is left at "1". Note that the DDL latch should be at "1" when a storage element passed the nominal verify (e.g., VvA) in steps 1116-1118 because that storage element also should have passed verify low (e.g., VvAL) in steps 1112-1114. Note that setting the DDL latch appropriately in step 1112 allows information to be maintained as to the intended program state for one of the states.

Note that the state to be tracked may also include the erase state. Note that there is not a verify operation for storage elements that are to stay in the erase state. Therefore, for these storage elements the status of the DDL latch should not change at step 1114. When a state other than the erase state is being tracked, the DDL latch for storage elements to remain erased may be initially set to "1". However, when the erase state is being tracked, the DDL latch may be initially set to "0". Therefore, it should remain at "0" throughout programming. In contrast, the DDL latch for other states may be set to "1" when verify low passes.

In step 1124, a determination is made whether there are additional states to verify. Note that early in the programming operation, it is not required that all states be verified. If there are more states to verify, then the verify reference voltage is increased in step 1126. The reference voltage may be increased to the verify low reference level for the next state. Then, the verify low pulse may be applied in step 1110. When all states that are to be verified at this time are verified, a determination is made whether all storage elements passed verify, in step 1128. Note that a certain number of storage elements may fail to reach their intended state, but be ignored. This can help to speed up programming.

If not all storage element pass verify (factored in that some may be allowed to fail), then the process 1100 returns to step 1106 to apply programming conditions based on the latches 394. For storage elements that are now locked out (as indicated by one or more of latches ADL, BDL, CDL), their bit lines may be set to Vdd. For storage elements to receive slow programming, their bit lines may be set to the intermediate voltage. In one embodiment, the DDL latch of those storage elements that are not locked out from further programming is checked to determine whether slow programming should be performed.

Figure 12:
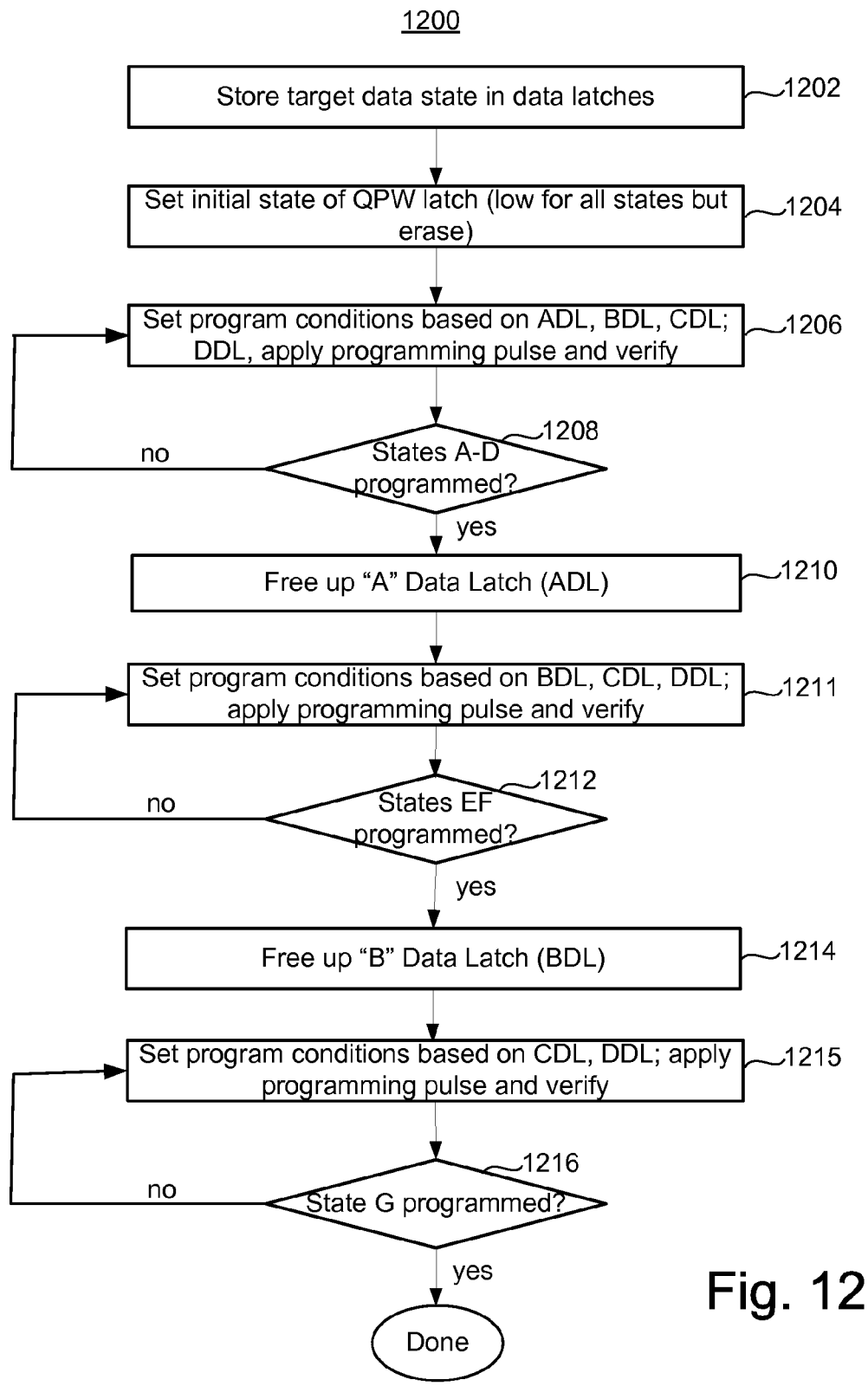
FIG. 12 is a flowchart of one embodiment of a process of operating data latches while programming and verifying non-volatile storage.

FIG. 12 is a flowchart of one embodiment of a process 1200 of operating data latches while programming and verifying non-volatile storage. Process 1200 provides further details of using the data latches differently depending on the stage of the programming process. FIG. 13A-FIG. 13D are tables that show status of data latches ADL, BDL, CDL, and DDL throughout various stages of process 1200.

FIG. 14 shows latch usage during various stages of one embodiment of programming. Briefly, the programming process may be divided between the following stages. In the pre-lockout stage, data latches may be set up. In the ABCDEFG stage, all states are being programmed. In the EFG stage, only the E-, F-, and G-states are being programmed. In the G-program stage, only the G-state is being programmed. In the EPD-stage, erratic program detection is being performed. In one embodiment, word line defects are detected during the EPD stage. Note also that the ADL latches are reset between the ABCDEFG stage and the EFG stage. Likewise, the BDL latches are reset between the EFG stage and the G stage. Further details are discussed in connection with the discussion of FIG. 12.

Process 1200 describes one embodiment in which the G-state is the tracked state. In step 1202, the target data states are stored in latches. FIG. 13A shows a table of initial states for latches ADL, BDL, and CDL.

In step 1204, the initial state of the DDL latches are set. In this embodiment, the initial state for storage elements to remain in the erased state is set to "1." The DDL for all other storage elements is set to "0." FIG. 13A shows a table of initial states of the DDL latches for memory cells targeted for various states. Steps 1202 and 1204 may occur during the pre-lockout stage (see FIG. 14).

In step 1206, one or more programming pulses are applied, followed by verifying one or more states. One embodiment of step 1206 includes performing steps 1108, 1110, 1112, 1116, and 1118 of FIG. 11 one or more times. For example, step 1108 might be performed once, followed by steps 1110, 1112, 1116, and 1118 to verify different states.

Initially, the programming starts in the ABCDEFG stage (see FIG. 14). The black bars in FIG. 14 indicate when a data latch is actively being used for programming or EPD. During the ABCDEFG stage, the ADL, BDL, and CDL latches are being used to store lockout information. The DDL latches are being used to store QPW status.

FIG. 13B shows an example of use of the latches during the ABCDEFG stage. At this time, any storage element that is locked out has a "1" in all of the ADL, BDL, and CDL latches. The erase case is shown in this state. For states A-G, the data to be programmed into the storage element is shown. However, when a storage element reaches its intended target state, its ADL, BDL, and CDL latches maybe set to "1". This was previously discussed as one possibility in step 1120 of FIG. 11. Thus, when determining whether a storage element is locked out during the ABCDEFG stage, the status of the ADL, BDL, and CDL may be checked.

FIG. 13B also shows an example of use of the DDL latches during the ABCDEFG stage. In one embodiment, a "1" in the DDL latch means that slow programming is to be used. Thus, any storage element that is not locked out, and that has a "1" in the DDL latch may receive slow programming.

Note that the DDL latch is being used differently for the G-state. For storage elements to be programmed to the G-state, the DDL latch is kept at "0" throughout the programming process, in one embodiment.

In step 1208, a determination is made whether storage elements targeted for states A-D are programmed. Note that it is not required that every storage element targeted for these states reaches its intended state. In one embodiment, some storage elements may be left under-programmed. If programming of the A-D states is not yet complete, the process returns to step 1206.

When storage elements targeted for states A-D are programmed, the ADL latches are freed up, in step 1210. This is reflected by the ADL reset in FIG. 14 after the ABCDEFG program stage. Referring to FIG. 13C, the ADL latches are free at this time. Because the ADL latches are free, they may be used for background caching, as one example. Further details of using data latches that are freed up during a program operation are described in U.S. Pat. No. 7,502,260, entitled "Method for Non-Volatile Memory with Background Data Latch Caching Operations During Program Operations, to Li et al., which is hereby incorporated in its entirety for all purposes.

Note that after the ADL latches are freed up, programming proceeds with the EFG program stage (see FIG. 14). At this time, only the BDL and CDL latches are used to store the lockout information, in one embodiment. Also, only the BDL and CDL latches are needed to contain the information needed to uniquely define which state a storage element is being programmed to. For example, the combination "01" uniquely defines the E-state, the combination "10" uniquely defines the F-state, the combination "00" uniquely defines the G-state, the combination "11" uniquely defines the lockout state, in one embodiment. Other bit assignments may be used.

Further, note that in FIG. 13C, the DDL latches of all storage elements below the E-state should be at "1". Storage elements being programmed to either the E-state or F-state could have either a "1" or "0" in the DDL latch, depending on whether verify low has passed. As before, the DDL latch for the G-state storage elements remains at "0". In one embodiment, no verify low is performed of the G-state storage elements. Therefore, the DDL latch should state "0" throughout programming. However, a verify low could be performed of the G-state, so long as the DDL latch is set to "0" when the storage element is locked out, as one example.

Next, programming continues with the EFG-stage (see FIG. 14). When determining how to apply programming conditions (step 1211 of FIG. 12), the status of the BDL and CDL latches may be used for lockout. Storage elements that are not locked out, and that have a "1" in the DDL latch may receive slow programming.

In step 1212, a determination is made whether the E and F states are programmed. If not the process continues to program and verify, using the status of latches BDL, CDL, and DDL.

When the E- and F-states are programmed, the BDL latches are freed up in step 1214. This is reflected by BDL reset at the end of the EFG program stage (see FIG. 14). As with the ADL latch, the BDL latch is free for purposes such as background caching.

FIG. 13D shows a table that represents the BDL latches being freed up. At this time, the only storage elements left to be programmed are those in the G-state. Therefore, the status of the CDL latch may uniquely describe whether a storage element is to be programmed to the G-state ("0" in this example) or is locked out ("1" in this example).

Note that the status of the DDL latch is "0" for G-state storage elements at this time. As was previously noted, the DDL latch may stay at "0" for the G-state storage elements throughout programming.

Programming then continues with the G-program stage (see, FIG. 14). In step 1215, program conditions are applied based on the status of CDL and DDL. The status of the CDL latch may be used to determine which storage elements are locked out. The status of the DDL latch remains "0" for all G-state storage elements in one embodiment. However, in one embodiment, the DDL latch may be used for QPW status. Therefore, if this is the case, then storage elements that are not locked out and have the DDL latch set to "1" may receive slow programming.

When the G-state storage elements are programmed (step 1216), the G-program stage is over. At this time, the CDL latch for all G-state storage elements should be "1". The DDL latch for all G-state storage elements should be "0". Note that in one embodiment, the DDL latch is "0" because it is not allowed to be set to "1" during the programming operation.

However, in one embodiment, the DDL latch is permitted to be set to "1" when the G-state storage element passes verify low. In this case, the DDL latch may be set to "0" when the G-state storage element passes verify high.

Regardless of whether the information from the DDL latch is kept in that latch, transferred to another latch, or some other storage location, the information of which storage elements were targeted for the G-state is maintained after the programming operation. Note that no extra data latches are needed. Also note that two of the data latches are freed up during programming for purposes such as background caching.

Figures 15A, 15B, 15C:
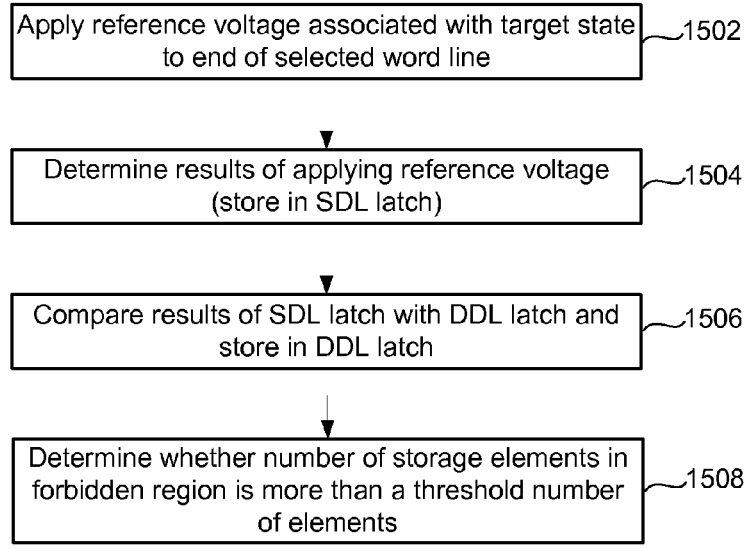
FIG. 15A is a flowchart of one embodiment of a process of determining whether a word line has a defect.
FIG. 15B is a table of one embodiment of data latch use during the process of FIG. 15A.
FIG. 15C is a table of one embodiment of data latch use during the process of FIG. 15A.

FIG. 15A is a flowchart of one embodiment of a process 1500 of determining whether a word line has a defect. Process 1500 may be performed during the EPD stage (see, FIG. 14, for example). Process 1500 is one embodiment of steps 1006-1010 form FIG. 10.

In step 1502, a reference voltage that is associated with the target state is applied to an end of the selected word line. In one embodiment, the reference voltage is an under-program voltage associated with the target state. Assuming this is the G-state, the Vgv_UP may be applied. Vgv_UP may be as high as the normal G-verify reference level (e.g., VvG in FIG. 5A). However, Vgv_UP may be lower than that reference level.

In one embodiment, the duration of this reference voltage is longer than the duration of the normal verify pulses. Note that since there are many verify pulses during a programming operation, it may be desirable to keep them relatively short. However, process 1500 only needs to apply a single reference voltage. Therefore, it may be longer in duration without significantly impacting overall programming speed. Step 1502 is one embodiment of step 1006.

In one embodiment, the reference voltage is an over-program voltage associated with the target state. For example, the reference voltage may be Vav_OP (FIG. 6B), with the A-state being tracked.

In step 1504, results of applying the reference voltage are determined. In one embodiment, these results are stored in a data latch in the sense amplifier. This latch will be referred to as SDL for purposes of discussion. Step 1504 is one embodiment of step 1008.

In step 1506, a determination may be made as to which storage elements read as having a threshold voltage below the reference voltage of step 1502 and were intended to be programmed to the tracked state. This may test for an under-programmed condition.

Referring to the table of FIG. 15B, in one embodiment, the DDL latch maintains the information as to which storage elements were intended to be programmed to the tracked state. In this example, the tracked state is the G-state. Thus, a "0" indicates that storage element was intended to be programmed to the G-state. The SDL latch may contain "0" if the read of step 1504 indicated a threshold voltage was below the reference voltage and a "1" if it was above. By taking the OR of the SDL and DDL latches the correct result may be produced. In one embodiment, the result is stored in the CDL latch.

The only time that the result in the CDL latch should be "0" is if both the DDL latch and the SDL latch are "0". This is the case for storage elements that were intended to be programmed to the G-state, but that had a threshold voltage below the reference voltage. Storage elements that were intended to be programmed to the G-state, but had a threshold voltage above the reference voltage should have a "1" in the CDL latch. Storage elements having a "1" in their DDL latch should also result in a "1" in the CDL latch.

As noted, in one embodiment, an over-programmed condition is used to test for a broken word line. In one embodiment of step 1506, a determination may be made as to which storage elements for the tracked state were over-programmed. This may include determining which memory cells have a threshold voltage above the reference voltage of step 1502 and were intended to be programmed to the tracked state.

FIG. 15C shows a table of latches to illustrate testing for over-programming of memory cells when the A-state is being tracked. The DDL latches for the A-state cells may be set to "0" during programming to track those memory cells (see step 1122, FIG. 11). DDL latches for all other states are set to "1" by the end of programming. Prior to process 1500, all DDL latches may be flipped, such that only A-state cells have a "1". In one embodiment, an AND is performed between the DDL and SDL latch and stored in the CDL latch. As noted above, the SDL latch may contain a "1" if the threshold voltage is above the reference voltage. Therefore, if both DDL and SDL are "1", this indicates an over-programmed A-state cell, in this example.

Note that process 1500 may effectively determine which storage elements are in region 902 (or below) of FIG. 9. Once it is determined which storage elements are in this condition, a determination may be made as to whether the number of such storage elements is greater than a threshold number of storage elements, in step 1508. Note that it is not required to count every storage element. In other words, counting may stop after the threshold number is reached. Steps 1506-1508 is one embodiment of step 1010.

Figure 16:
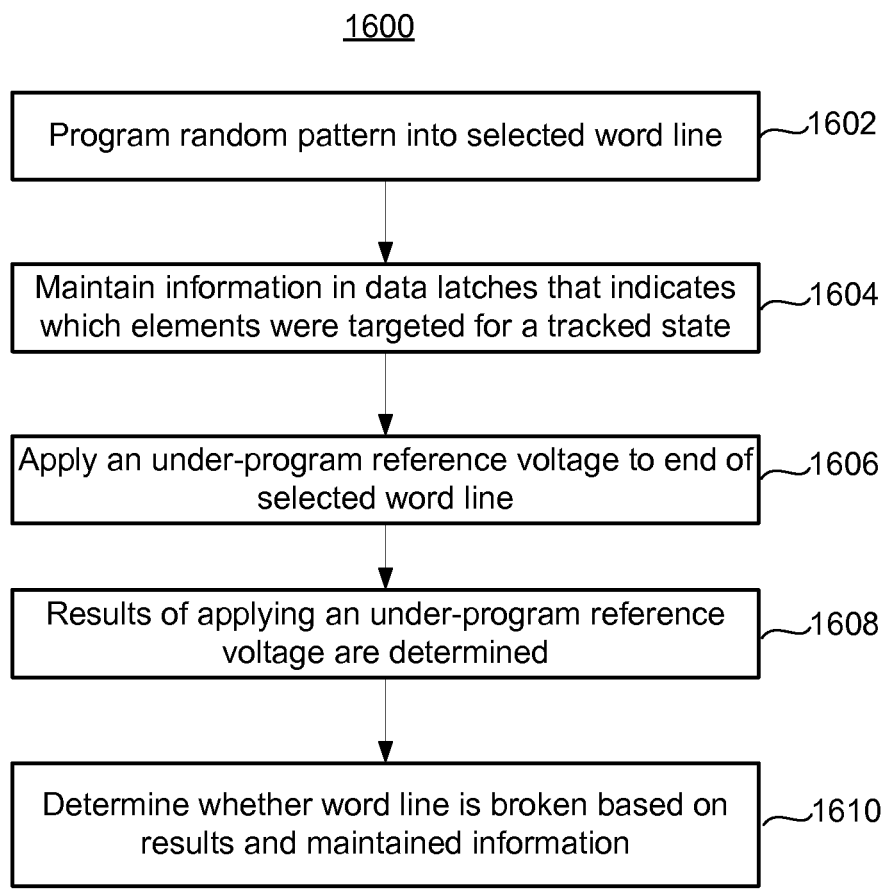
FIG. 16 is a flowchart of one embodiment of a process of determining broken word lines during device qualification.

In one embodiment, broken word line detection is used during device qualification. FIG. 16 is a flowchart of one embodiment of a process 1600 of determining broken word lines during device qualification. The process describes analyzing one word line. The process 1600 may be performed anytime. That is, the process could be performed in the field. However, typically it is performed at some point during qualification of the device.

In step 1602, a random pattern is programmed onto a selected word line. Note that this is one embodiment of step 1002.

In step 1604, information is maintained in data latches that indicates which storage elements were targeted for a tracked state. In one embodiment, this is the highest data state. However, another state could be tracked. Note that this is one embodiment of step 1004.

In step 1606, an under-program reference voltage is applied to the selected word line. The under-program reference voltage may be one for the tracked state. That is, it is for determining whether storage elements targeted for the tracked state were under-programmed. In one embodiment, the pulse duration is sufficiently long to allow the under-program reference voltage to reach a steady state past a break in the word line. Note that this is one embodiment of step 1006.

In step 1608, results of applying the under-program voltage are determined. Note that this is one embodiment of step 1008.

In step 1610, a determination is made whether the selected word line is broken based on the results. Examples for making this determination have been discussed above. Note that this is one embodiment of step 1010.

Figure 17:
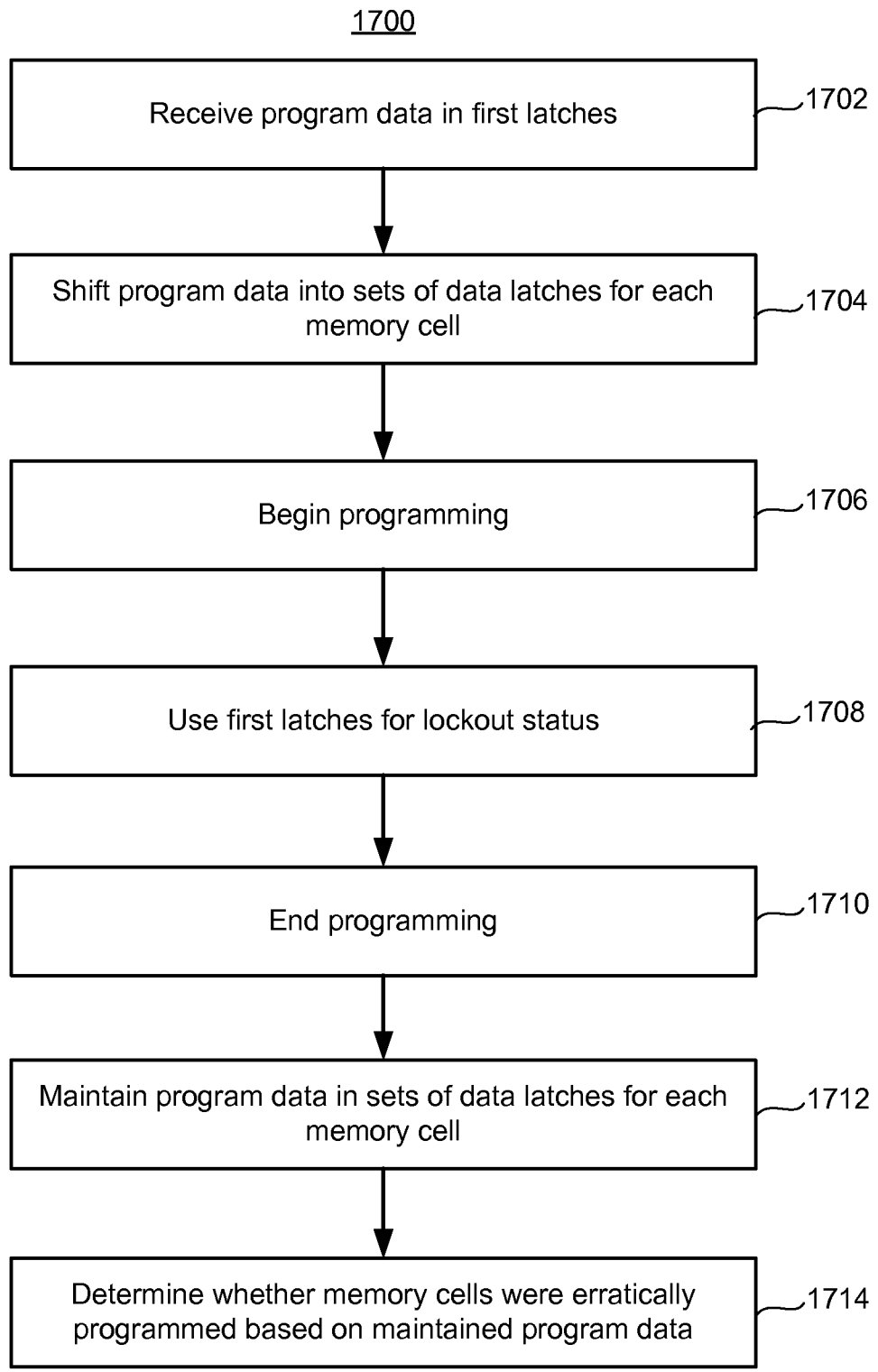
FIG. 17 is a flowchart of one embodiment of a method of detecting erratically programmed storage elements.

FIG. 17 is a flowchart of one embodiment of a method of detecting erratically programmed storage elements. This method does not require that any additional data latches be used. In one embodiment, lockout status is stored in a data latch that is used for receiving and sending data across a data bus between the memory array and controller. This data latch may be accessible to the user, at least at some time. However, during programming this latch might not be accessible to the user. The XDL latch (see FIG. 3 and associated discussion) is one example of a latch that may be used for storing lockout status.

In step 1702, program data is received in first latches. In one embodiment, the controller 244 sends program data serially across lines 234 to the memory die 212. This data may be sent serially over the data bus (320, FIG. 3) to the I/O interface 398. From the I/O interface 398, the program data may be transferred to the XDL latches. Note that the program data might only be stored temporarily in the XDL latches.

In step 1704, the program data is shifted or transferred into sets of data latches for each of the storage elements. In one embodiment, the program data is shifted from the XDL latch to the ADL, BDL, and CDL latches.

In step 1706, programming of the storage elements is begun based on the program data in the ADL, BDL, and CDL latches. Also, the first latches (e.g., XDL) is used for lockout status during programming, in step 1708. In step 1710, programming completes. Further details of steps 1706-1710 are discussed below.

In step 1712, the program data is maintained in the sets of data latches after programming. For example, the program data is maintained in the ADL, BDL, and CDL latches.

In step 1714, a determination is made whether storage elements were erratically programmed based on the maintained program data. Note that this may also be referred to as determining whether storage elements were mis-programmed. Erratic programming may include over- or under-programming.

Figure 18:
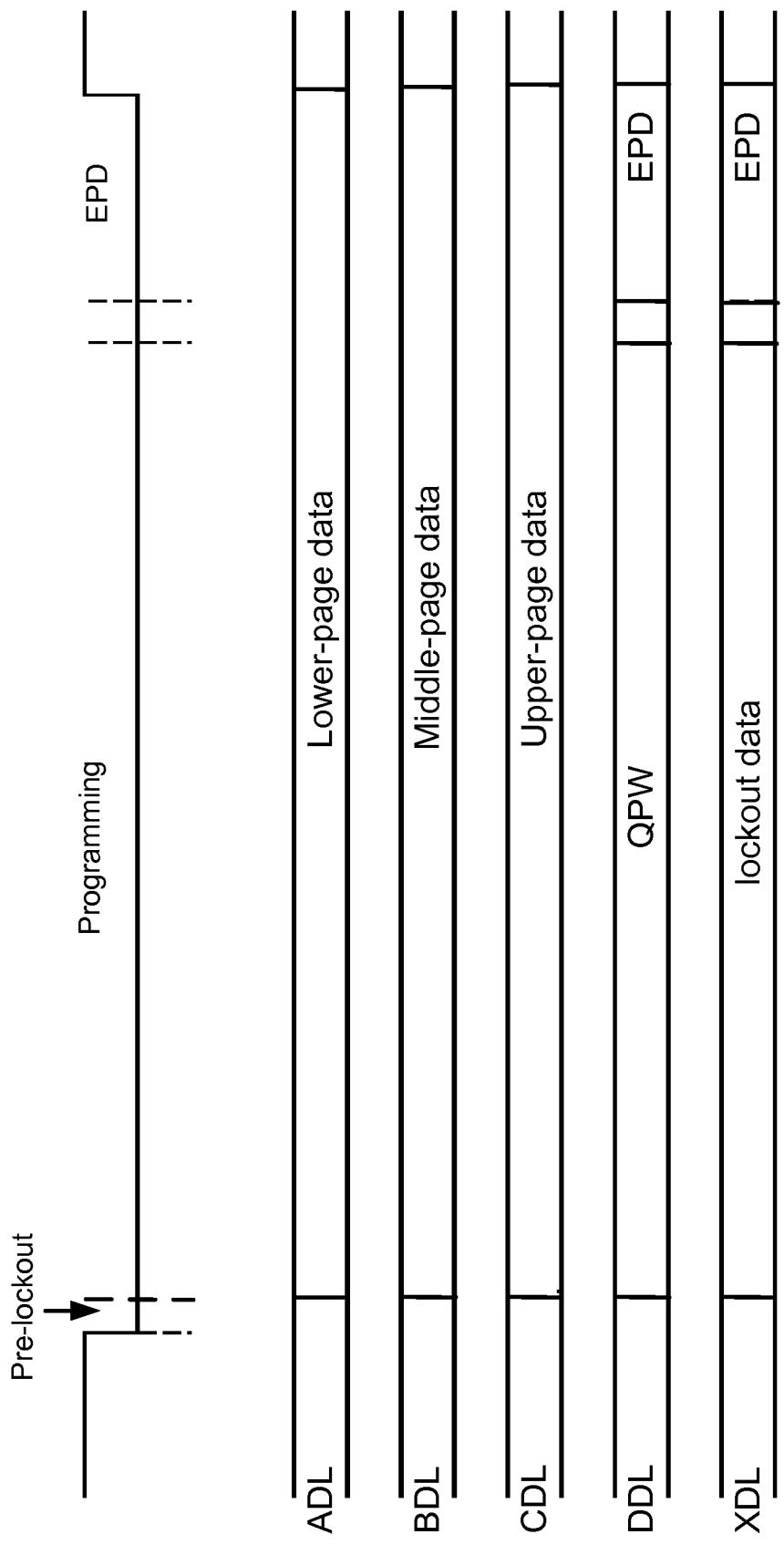
FIG. 18 is a diagram that illustrates how latches are used during one embodiment of programming and erratic program detection (EPD).

FIG. 18 is a diagram that illustrates how latches are used during one embodiment of programming and erratic program detection (EPD). The ADL, BDL, and CDL latches store program data during both the programming and EPD stages. In one embodiment, the ADL latches stores lower-page data, the BDL latches store middle page data, and the CDL latches store upper-page data. There may be more or fewer than three pages of data. The DDL latches store QPW status during the programming stage. The use of the DDL latches during the EPD stage will be discussed below. The XDL latches store lockout status during the programming stage. The use of the XDL latches during the EPD stage will be discussed below.

FIG. 19 is a flowchart of one embodiment of a process 1900 for programming storage elements. This programming method is one embodiment of steps 1706-1710 of FIG. 17. Thus, process 1900 may begin after the program data has been transferred to the set of data latches (see step 1704, FIG. 17). Some steps of process 1900 are similar to those of process 1100 and will use the same reference number.

In step 1902, the initial state of the XDL latches are set. In step 1104, the initial state of the DDL latches are set. FIG. 20A depicts one example of how the latches may be set after step 1104. The XDL latches are set to "1" for storage elements being kept in the erased state and set to "0" for all other storage elements. Likewise, the DDL latches are set to "1" for storage elements being kept in the erased state and set to "0" for all other storage elements.

In step 1906, programming conditions are applied based on the XDL latches and the DDL latches. For example, bit line voltages are established. In one embodiment, three categories are used. One for storage elements that are locked out (or inhibited) from any further programming, one is for storage elements that are still undergoing fast programming, and one is for storage elements that are to receive slower programming because they are near their target threshold voltages.

In one embodiment, a storage element having an XDL set to "1" is locked out. In one embodiment, a storage element having an XDL set to "0" but the DDL latch set to "1" receives slower programming. In one embodiment, a storage element having an XDL set to "0" and DDL set to "0" receives normal or fast programming.

In one embodiment, bit lines for storage elements locked out or inhibited storage elements are set to Vdd, bit lines for storage elements undergoing nominal (or fast) programming are set to ground (e.g., Vss), bit lines for the third category are set to an intermediate voltage between ground and Vdd. This intermediate voltage slows down the programming to some extent.

FIG. 20B shows a table that demonstrates how the latches may be used during one embodiment of programming. For storage elements targeted for the A- through G-state a program state and a lockout state is depicted, depending on whether the storage element is still undergoing programming or has been locked out from further programming. Storage elements to remain in the erased state (Er) may have all latches at "1". These elements may be locked out throughout programming. For storage elements targeted for the A- through F-states, the following may apply. The program data may remain in the ADL, BDL, and CDL latches throughout programming. While still undergoing programming, the DDL latch may contain QPW data. Note that the QPW data indicates whether the storage element is to receive fast or slow programming. The XDL latch indicates whether or not the storage element is locked out. In one embodiment, storage elements targeted for the G-state do not receive slow programming. Thus, the DDL latch is not used to store QPW status for G-state cells in one embodiment. Therefore, the DDL latch may be set to "0" while programming, and "1" when programming is complete. However, optionally, the DDL latch could store QPW status for G-state cells.

In step 1108, one or more programming pulses are applied to the selected word line. A pass voltage (e.g., Vpass) may be applied to unselected word lines.

In step 1110, a verify low pulse is applied to the selected word line. Referring to FIG. 5A, VvAL may be applied. In step 1112, sensing is performed to determine whether storage elements that were intended to be programmed to the state associated with the verify low pulse have reached the verify low point. For example, storage elements intended to be programmed to the A-state (as indicated in ADL, BDL, CDL) are sensed to determine whether their threshold voltage is at or above VvAL. In one embodiment, the current of the bit line is sensed.

In step 1114, the DDL latches are set based on the results of step 1112. Note that the DDL latches in question are those associated with the state that was just verified. In one embodiment, the DDL latch is set to "1" to indicate that slow programming is to be performed. For example, storage elements intended to be programmed to the A-state that have a threshold voltage above VvAL have their DDL latch set to "1".

In step 1116, the verify reference voltage is increased to the associated verify high reference voltage for the present state being verified. For example, the reference voltage is set to VvA (see, FIG. 5A). In one embodiment, step 1116 involves increasing the voltage on the selected word line.

In step 1118, sensing is performed to determine whether storage elements that were intended to be programmed to the state associated with the nominal verify pulse have reached the nominal verify point. For example, storage elements intended to be programmed to the A-state are sensed to determine whether their threshold voltage is at or above VvA. In one embodiment, the current of the bit line is sensed.

In step 1920, the XDL latches are set to lockout further programming for storage elements that passed verify high. In other words, a lockout condition is stored in the XDL latches. In one embodiment, an XDL latch is set to "1" to indicate that programming is to be inhibited for its associated storage element. Note that the program data in the ADL, BDL, and CDL latches is maintained.

In step 1124, a determination is made whether there are additional states to verify. If not all storage element pass verify (factored in that some may be allowed to fail), then the process 1900 returns to step 1906 to apply programming conditions based on the latches. On the other hand, if all (in one embodiment some may be allowed to fail verify) storage elements passed verify (step 1128), then the programming process 1900 concludes.

FIG. 21 is a flowchart of one embodiment of a process 2100 of erratic program detection for non-volatile storage elements. Process 2100 is one embodiment of steps 1712 and 1714 from FIG. 17. Process 2100 may be performed after programming using process 1900 (FIG. 19). In process 2100, under-programming or over-programming can be determined. Also, the process 2100 may detect erratic programming for more than one state. In one embodiment, erratic programming of all of the program states is determined.

Figures 22A, 22B:
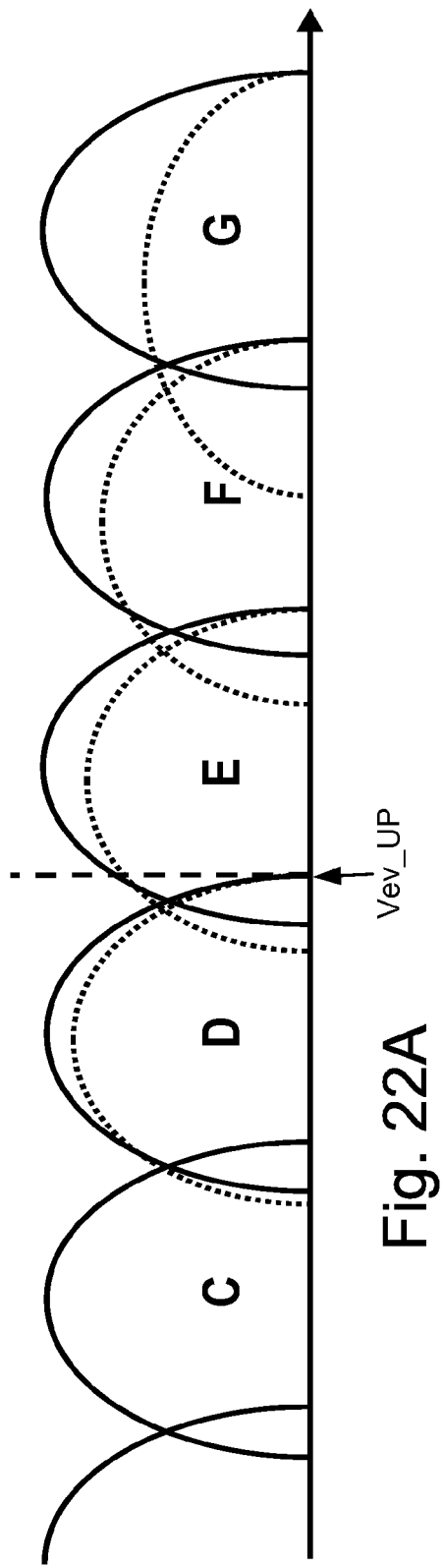
FIG. 22A shows nominal threshold voltage distributions and erratic distributions.
FIG. 22B shows a table that demonstrates how the latches may be used during one embodiment of erratic program detection.

An example will be discussed of testing the E-state for under-programming. FIG. 22A depicts threshold voltage distributions and an under-programmed reference voltage Vev_UP for determining whether storage elements intended for the E-state are under-programmed. FIG. 22A shows nominal threshold voltage distributions for the C-through G-state (and a portion of the B-state) in solid lines. Note that there is some overlap between states. Some overlap is permitted, even immediately after programming. As has been discussed, error correction may be used to accurately read the storage elements even with some overlap. The dashed lines represent possible erratic programming with respect to the nominal distributions. In this example, there are significantly more E-state storage elements below Vev_UP than for the nominal case.

In step 2101, a state is selected to test for erratic programming. For example, the E-state is selected. Also, step 2101 may select to test for under-programming (or alternatively over-programming).

In step 2102, a reference voltage associated with the selected state is applied to the selected word line. For example, referring to FIG. 22A, the reference voltage Vev_UP may be applied. Referring back to FIG. 6B, it was discussed that an under-programmed reference voltage may be used. In FIG. 6A, the reference voltages Vav_UP, Vbv_UP and Vcv_UP are depicted.

In step 2104, results of applying the reference voltage are determined. In one embodiment, results may be stored in a latch other than latches 394. Herein, an SDL latch is referred to as being able to store read results. The SDL latch could be located in sense circuitry 370, but could be located elsewhere. In one embodiment, the SDL latch will contain a "0" if the storage element has a threshold voltage below the reference voltage, and a "1" if the storage element has a threshold voltage at or above the reference voltage.

In step 2106, the DDL latches are updated based on the SDL latches and the program data in the ADL, BDL, and CDL latches. Referring to FIG. 22B, the SDL latches may contain either "0" or "1" depending on what was read in response to the reference voltage of step 2102. The DDL latch of all storage elements but the E-state storage elements is set to "1", as those storage elements are not being currently tested.

The DDL latch for the E-state cells is set to "0" to indicate under-programming and "1" to indicate normal programming, in one embodiment. E-state storage elements that were read as having a threshold voltage below Vev_UP have their DDL latch set to "0" in one embodiment. On the other hand, E-state storage elements that were read as having a threshold voltage at or above Vev_UP have their DDL latch set to "1" in this embodiment. In one embodiment, the data from the SDL latch is transferred to the DDL latch for E-state storage elements in step 2106.

In step 2108, the XDL latches are updated. In one embodiment, erratic program status is stored in the XDL latches. In one embodiment, the data from the DDL latch is transferred to the XDL latch for E-state storage elements in step 2108.

In step 2110, the number of mis-programmed (or erratically programmed) storage elements is determined. In one embodiment, a count is made of the number of DDL latches that are set to "0". Note that step 2108 could be performed after step 2110. Also note that transferring the data from DDL to XDL preserves the count for later iterations of the process, which test other states for erratic programming.

In step 2112, a determination is made whether this count is greater than an allowed threshold. If so, then this is reported in step 2114. Note that it is not required to count every storage element that was erratically programmed. In one embodiment, counting proceeds until the threshold is reached (or all cells are counted). If the threshold is reached, counting may stop.

Figures 22C, 22D, 22E:
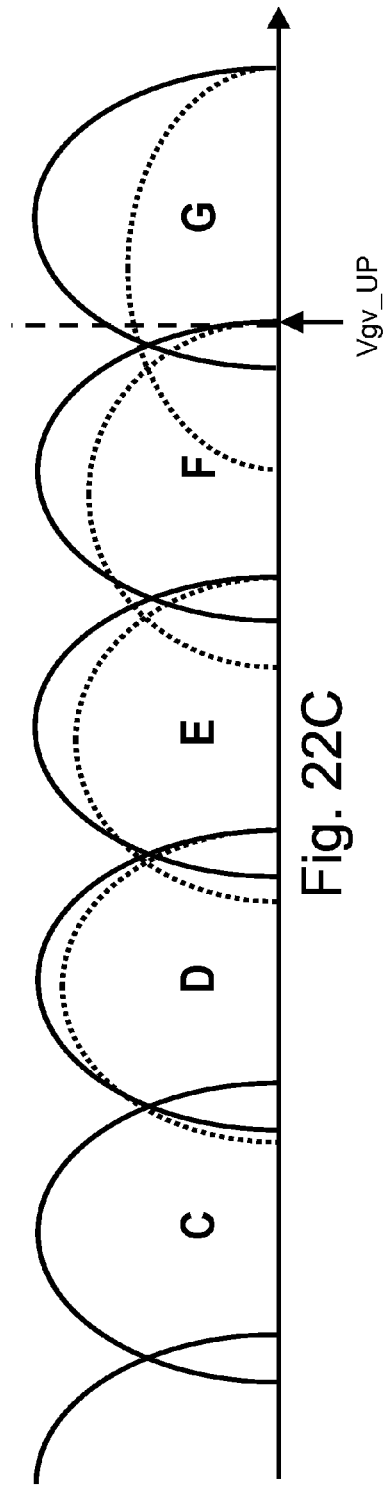
FIG. 22C depicts threshold voltage distributions and an under-programmed reference voltage for determining whether storage elements intended for the G-state are under-programmed.
FIG. 22D shows a table that demonstrates how latches may be used during one embodiment of erratic program detection.
FIG. 22E shows a table that demonstrates how latches may be used during one embodiment of erratic program detection.

In step 2116, a determination is made whether there is another state to test for erratic programming. If so, step 2101 is returned to. For the sake of discussion, an example of testing the G-state for erratic programming will be presented. In the next iteration of step 2102, the reference voltage may be Vgv_UP, as depicted in FIG. 22C to test for under-programming of the G-state. After performing steps 2104-2108, the latches may be in the states depicted in FIG. 22D. As before, the ADL, BDL, CDL latches maintain the program data. The SDL latches contain the results of reading using the reference voltage Vgv_UP. The DDL latches for all storage elements but the G-state are set to "1" in this embodiment, as these storage elements are not presently being tested. However note that the XDL latches for the E-state storage elements maintain the results from testing under-programming. The DDL latches for the G-state storage elements indicate whether the storage elements were under-programmed. Likewise, for the XDL latches. Under-programming may be determined by noting which storage elements were intended to be programmed to the G-state (as indicated by ADL, BDL, CDL latches), but had a threshold voltage below VgV_UP (as indicated by the SDL latches).

Similar to the E-state, a count may be made of under-programmed G-state storage elements in step 2112. In one embodiment, the states of the DDL latches are analyzed. Note that all of the DDL latches can be analyzed, which could simplify the analysis. That is, it is not required that only the DDL latches of G-state storage elements be analyzed. Also note that the threshold used to test the G-state may be different for E-state. In general, each state may have its own threshold, or two or more states may share the same threshold.

The process can continue to analyze more states in this manner. After all desired states are analyzed, the process continues to step 2118 to count the total number of erratically programmed storage elements. If the count is more than a threshold, this is reported in step 2122. Note that this threshold could be different from those used in step 2112. In one embodiment, this test is for under-programmed storage elements. In one embodiment, this test is for over-programmed storage elements. Referring to FIG. 22E, the count may be based on the XDL latches. In this example, the XDL latches for the E-state and G-state indicate whether those storage elements were under-programmed. Note that process 2100 could have tested for other states as well. Therefore, the count can be made for almost any combination of states. Typically, the Er state is not tested for under-programming. In some embodiments, the G-state is not tested for over-programming.

In one embodiment, process 2100 is used to test for over-programming. In this case, a different set of reference voltages might be used in step 2102. Referring to FIG. 6B, over-program reference voltages such as Verase_OP, Vav_OP, Vbv_OP, etc. may be used. Note that those over-program reference voltages are just one example set; others may be used.

Also note that process 2100 may be used for storage elements that store more or fewer than three bits per storage element. Thus there might be more or fewer latches for storing program data than the ADL, BDL, and CDL latches. Also note that it is not required the quick pass write (QPW) is performed. Therefore, the DDL latches are not required to store the QPW data during programming.

As previously mentioned, the XDL latches may be accessible to the user under at least some conditions. In one embodiment, when programming is not using the XDL latches for storing lockout status, the XDL latches are freed up during programming for user purposes (such as background caching). The user may also be able to effectively access the XDL latches by sending program data the memory array, regardless of whether the XDL latches will be used to store lockout status.

Figure 23:
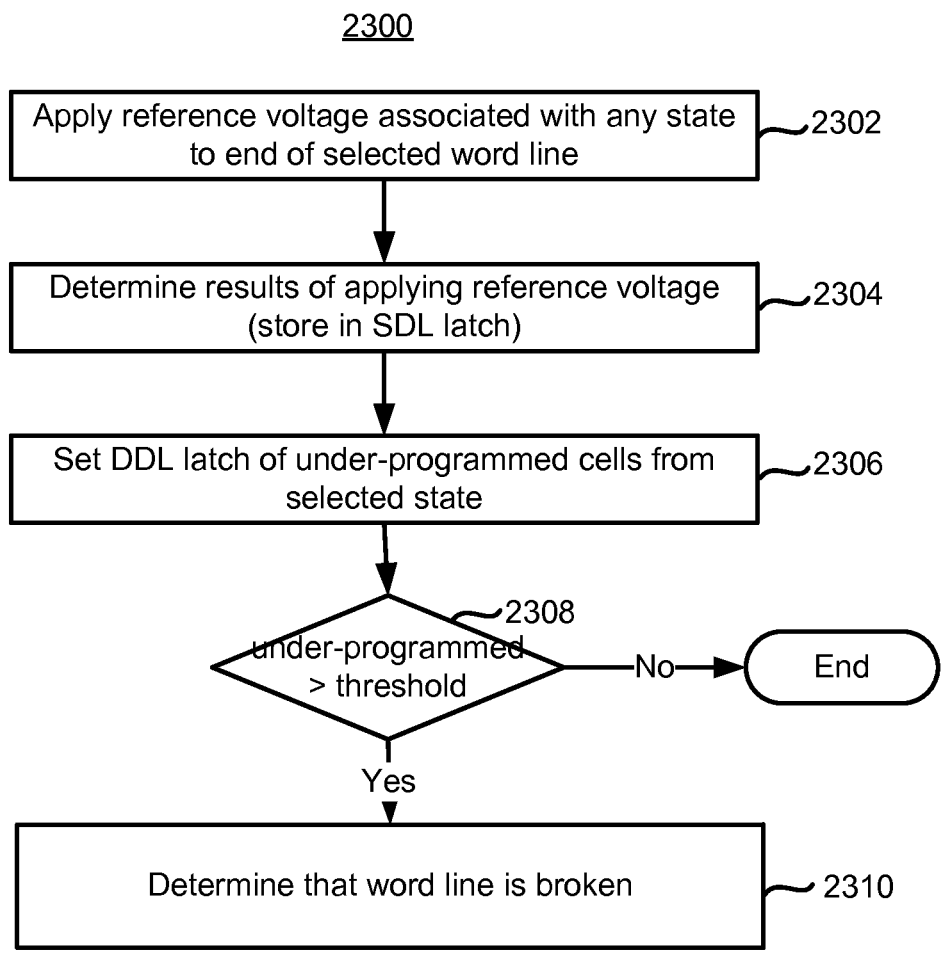
FIG. 23 is a flowchart of one embodiment of a process for detecting a broken word line.

In one embodiment, process 1700 is used to determine whether a word line is broken. FIG. 23 is a flowchart of one embodiment of a process 2300 for detecting a broken word line. Process 2300 may be performed during the EPD stage (see, FIG. 18, for example). Steps 2302-2308 of process 2300 are one embodiment of steps 1712 and 1714 of process 1700. Prior to performing process 2300, the storage elements may be programmed using steps 1702-1710. Recall that the program data is maintained in latches ADL, BDL, and CDL in one embodiment. Also, the XDL latches are used to store lockout information, in one embodiment.

In step 2302, a reference voltage that is associated with any state is applied to an end of the selected word line. In one embodiment, the reference voltage is an under-program voltage associated with the selected state. Assuming this is the G-state, the voltage Vgv_UP may be applied. Vgv_UP may be as high as the normal G-verify reference level (e.g., VvG in FIG. 5A). However, Vgv_UP may be lower than that reference level. Note that a different state could be tested.

In one embodiment, the duration of this reference voltage is longer than the duration of the normal verify pulses. Note that since there are many verify pulses during a programming operation, it may be desirable to keep them relatively short. However, process 2300 only needs to apply a single reference voltage. Therefore, it may be longer in duration without significantly impacting overall programming speed.

In step 2304, results of applying the reference voltage are determined. In one embodiment, these results are stored in a data latch in the sense amplifier. For example, results may be stored in SDL.

In step 2306, the DDL latch is set to indicate which storage elements from the selected state were under-programmed. For example, G-state storage elements (as determined by ADL, BDL, CDL) have their DDL latch set to "0" if their threshold voltage is below Vgv_UP (as indicated by their SDL latch). On the other hand, G-state storage elements (as determined by ADL, BDL, CDL) have their DDL latch set to "1" if their threshold voltage is at or above Vgv_UP (as indicated by their SDL latch). Storage elements for all other states may have their DDL latches set to "1", as they are not under test at this point.

In step 2308, a determination is made whether the number of under-programmed storage elements is greater than a threshold amount. If so, then is it determined that the word line is broken in step 2310. Otherwise, the process ends.

One embodiment includes a method for operating non-volatile storage that includes the following. A group of non-volatile storage elements that are associated with a word line are programmed to a plurality of data states. Information is maintained after the programming is complete that indicates which of the non-volatile storage elements were intended to be programmed to a first of the data states. A first reference voltage is applied to a first end of the word line after the programming. The first reference voltage is associated with the first data state. Results of applying the reference voltage are determined. A determination is made whether the word line has an abnormally high resistance portion based on the results and the maintained information.

One embodiment includes a method for operating non-volatile storage, which comprises the following. A group of non-volatile storage elements that are associated with a word line are programmed. The non-volatile storage elements are programmed to a plurality of data states. The programming including applying a first reference voltage to a first end of the word line to verify a first state of the states. The first reference voltage has a first duration. Information is maintained after the programming is complete that indicates which of the non-volatile storage elements were intended to be programmed to the first data state. A second reference voltage is applied to the first end of the word line after the programming. The second reference voltage is associated with the first data state, wherein the second reference voltage has a second duration that is longer than the first duration. Results of applying the second reference voltage are determined. A determination is made whether the word line is defective based on the results and the maintained information. In one embodiment, the defect is a broken word line.

One embodiment includes a non-volatile storage device comprising a plurality of non-volatile storage elements, a plurality of word lines, and one or more management circuits in communication with the plurality of word lines. A first word line is associated with a group of non-volatile storage elements in the plurality. Each of the plurality of word lines having a first end. The one or more management circuits program a group of non-volatile storage elements that are associated with a word line to a plurality of data states. The one or more management circuits maintain information after the programming is complete that indicates which of the non-volatile storage elements were intended to be programmed to a first data state of the plurality of data states. The one or more management circuits apply a first reference voltage to a first end of the word line after the programming. The first reference voltage is associated with the first data state. The one or more management circuits determine results of applying the reference voltage. The one or more management circuits determine whether the word line has an abnormally high resistance portion based on the results and the maintained information.

One embodiment includes a non-volatile storage device comprising a plurality of non-volatile storage elements arranged as NAND strings, a plurality of word lines, and one or more management circuits in communication with the plurality of word lines. A first word line is associated with a group of non-volatile storage elements in the plurality. Each of the plurality of word lines having a first end. The one or more management circuits program the group of non-volatile storage elements that are associated with the first word line. The non-volatile storage elements are programmed to a plurality of data states. The programming includes applying a first reference voltage to a first end of the word line to verify a first state of the states. The first reference voltage has a first duration. The one or more management circuits maintain information after the programming is complete that indicates which of the non-volatile storage elements were intended to be programmed to the first data state. The one or more management circuits apply a second reference voltage to the first end of the word line after the programming. The second reference voltage is associated with the first data state, wherein the second reference voltage has a second duration that is longer than the first duration. The one or more management circuits determine results of applying the second reference voltage, the one or more management circuits determine whether the word line is defective based on the results and the maintained information.

One embodiment includes a method for operating non-volatile storage, comprising the following. Program data is received for a plurality of non-volatile storage elements that are associated with a word line. The data may be received at a plurality of first latches in a memory array. The program data is transferred from the first latches to respective sets of data latches for each of the non-volatile storage elements. The non-volatile storage elements are programmed to a plurality of data states. Lockout data is stored in the plurality of first latches during the programming. The program data is maintained in the sets of data latches after the programming is complete. Erratic programming of the non-volatile storage elements is determined based on the program data maintained in the sets of data latches.

One embodiment includes a non-volatile storage device comprising a plurality of non-volatile storage elements, a plurality of word lines, a plurality of sets of latches, and one or more management circuits in communication with the plurality of non-volatile storage elements, the plurality of word lines and the plurality of sets of latches. A first word line is associated with a group of non-volatile storage elements in the plurality. Each set of latches is associated with one of the non-volatile storage elements in the group. The set of latches associated with each non-volatile storage element includes a first latch for receiving program data. The set of latches also includes data latches for storing the data to be programmed into the non-volatile storage element. The one or more management circuits transfer program data for the group of non-volatile storage elements to the first latches. The one or more management circuits transfer the program data from the first latches to respective data latches for each of the non-volatile storage elements in the group. The one or more management circuits program the non-volatile storage elements in the group to a plurality of data states. The one or more management circuits store lockout data in the first latches while programming the group of non-volatile storage elements. The one or more management circuits maintain the program data in the data latches after the programming is complete. The one or more management circuits determine whether non-volatile storage elements in the group were erratically programmed based on the program data maintained in the data latches.

One embodiment includes a method for operating non-volatile storage, comprising the following. Program data is transferred serially over a bus between a memory controller and a memory array. The program data is for a plurality of non-volatile storage elements that are associated with a word line. The program data is temporarily stored in first data latches that are associated with respective ones of the plurality of non-volatile storage elements. The program data is shifted from the first latches to respective sets of data latches for each of the non-volatile storage elements. The non-volatile storage elements are programmed to a plurality of data states based on the program data. A lockout condition is stored in the first latches during the programming. The programming is based on the lockout condition. The program data is maintained in the sets of data latches after the programming is complete. A determination is made whether at least a group of the non-volatile storage elements that were intended to be programmed to a first of the data states were over-programmed or under-programmed based on the program data maintained in the sets of data latches.

One embodiment includes a non-volatile storage device comprising a plurality of non-volatile storage elements in a memory array, a plurality of word lines, a plurality of sense blocks in the memory array, and one or more management circuits in communication with the plurality of non-volatile storage elements, the plurality of word lines and the plurality of sense blocks. A first word line is associated with a group of non-volatile storage elements in the plurality. A sense block has an I/O interface for receiving data to be programmed into the memory array and for providing data that is read from the memory array. Each of the sense blocks has at least one set of latches. Each set of latches is associated with one of the non-volatile storage elements in the group. The set of latches associated with each non-volatile storage element includes a first latch for receiving program data from the I/O interface, and a set of data latches for storing the data to be programmed into the non-volatile storage element. The one or more management circuits transfer program data serially into the I/O interface. The one or more management circuits temporarily store the program data in the first data latches that are associated with respective ones of the group of non-volatile storage elements. The one or more management circuits shift the program data from the first latches to respective sets of data latches for each of the non-volatile storage elements in the group. The one or more management circuits program the non-volatile storage elements to a plurality of data states based on the program data. The one or more management circuits store a lockout condition in the first latches during the programming. The programming is based on the lockout condition. The one or more management circuits maintain the program data in the sets of data latches after the programming is complete. The one or more management circuits determine whether at least a group of the non-volatile storage elements that were intended to be programmed to a first of the data states were over-programmed or under-programmed based on the program data maintained in the sets of data latches.

The foregoing detailed description has been presented for purposes of illustration and description. It is not intended to be exhaustive or to limit embodiments to the precise form disclosed. Many modifications and variations are possible in light of the above teaching. The described embodiments were chosen in order to best explain principles and practical applications, to thereby enable others skilled in the art to best utilize various embodiments and with various modifications as are suited to the particular use contemplated. It is intended that the scope be defined by the claims appended hereto.

We claim:

1. A method for operating non-volatile storage, comprising:
   programming a group of non-volatile storage elements that are associated with a word line, the non-volatile storage elements are programmed to a plurality of data states;
   maintaining information after the programming is complete that indicates which of the non-volatile storage elements were intended to be programmed to a first data state of the plurality of data states;
   applying a first reference voltage to a first end of the word line after the programming, the first reference voltage is associated with the first data state;
   determining results of applying the reference voltage; and
   determining whether the word line has an abnormally high resistance portion based on the results and the maintained information.

2. The method of claim 1, wherein the programming includes:
   applying a second reference voltage to the first end of the word line to verify whether non-volatile storage elements are programmed to the first data state, the first reference voltage has a first duration, the second reference voltage has a second duration that is shorter than the first duration.

3. The method of claim 2, wherein the second duration is not sufficient for the second reference voltage to cause non-volatile storage elements that were intended to be programmed to the first data state and that were past the abnormally high resistance portion of the word line to conduct a current, the first duration is sufficient for the first reference voltage to cause non-volatile storage elements that were intended to be programmed to the first data state and that were past the abnormally high resistance portion of the word line to conduct a current.

4. The method of claim 2, wherein upon initial application of the first and second reference voltages, a second end of the word line is coupled to a voltage that is greater than the first and second reference voltages by a voltage on an adjacent word line, the second duration is not sufficient for the second end of the word line to return to the second reference voltage, the first duration is sufficient for the second end of the word line to return to the second reference voltage.

5. The method of claim 1, wherein the determining whether the word line has an abnormally high resistance portion includes:
   determining whether the non-volatile storage elements that were both intended to be programmed to the first data state and conducted a current in response to the first reference voltage is greater than a threshold number of the non-volatile storage elements.

6. The method of claim 1, wherein the determining whether the word line has an abnormally high resistance portion includes:
   determining whether the non-volatile storage elements that were both intended to be programmed to the first data state and failed to conduct a current in response to the first reference voltage is greater than a threshold number of the non-volatile storage elements.

7. The method of claim 1, wherein the information for a first of the non-volatile storage elements is maintained in a data latch that is used during the programming of the first non-volatile storage element.

8. The method of claim 7, further comprising freeing up at least one other data latch that stores information regarding the state to be programmed into the first non-volatile storage element, the data latch is freed prior to completion of programming.

9. The method of claim 1, wherein the programming includes:
   programming a pattern other than programming all of the non-volatile storage elements in the group to the highest data state of the plurality of data states, the programming is performed during device qualification.

10. A method for operating non-volatile storage, comprising:
    programming a group of non-volatile storage elements that are associated with a word line, the non-volatile storage elements are programmed to a plurality of data states, the programming including applying a first reference voltage to a first end of the word line to verify a first data state of the data states, the first reference voltage having a first duration;
    maintaining information after the programming is complete that indicates which of the non-volatile storage elements were intended to be programmed to the first data state;
    applying a second reference voltage to the first end of the word line after the programming, the second reference voltage is associated with the first data state, wherein the second reference voltage has a second duration that is longer than the first duration;
    determining results of applying the second reference voltage; and
    determining whether the word line is defective based on the results and the maintained information.

11. The method of claim 10, wherein the first duration is not sufficient for the first reference voltage to cause non-volatile storage elements that were intended to be programmed to the first data state and that were past a break in the word line to conduct a current, the second duration is sufficient for the second reference voltage to cause non-volatile storage elements that were intended to be programmed to the first data state and that were past the break in the word line to conduct a current.

12. The method of claim 10, wherein the first duration is not sufficient for a second end of the word line to reach the first reference voltage, the second duration is sufficient for the second end of the word line to reach the second reference voltage.

13. The method of claim 12, wherein the determining whether the word line is defective includes:
    determining whether the non-volatile storage elements that were both intended to be programmed to the first data state and conducted a current in response to the second reference voltage is greater than a threshold number of the non-volatile storage elements.

14. The method of claim 10, wherein the determining whether the word line is defective includes:

determining whether non-volatile storage elements that were intended to be programmed to the first data state were over-programmed.

15. The method of claim 11, further comprising freeing up data latches that store the state to be programmed into each of the non-volatile storage elements, the data latches are freed prior to completion of programming.

16. The method of claim 10, wherein the programming includes:
programming a random pattern.

17. A non-volatile storage device comprising:
a plurality of non-volatile storage elements;
a plurality of word lines, a first word line is associated with a group of non-volatile storage elements in the plurality, each of the plurality of word lines having a first end;
one or more management circuits in communication with the plurality of word lines, the one or more management circuits program the group of non-volatile storage elements that are associated with the first word line to a plurality of data states, the one or more management circuits maintain information after the programming is complete that indicates which of the non-volatile storage elements were intended to be programmed to a first data state of the plurality of data states, the one or more management circuits apply a first reference voltage to a first end of the word line after the programming, the first reference voltage is associated with the first data state, the one or more management circuits determine results of applying the reference voltage, the one or more management circuits determine whether the word line has an abnormally high resistance portion based on the results and the maintained information.

18. The non-volatile storage device of claim 17, wherein the one or more management circuits apply a second reference voltage to the first end of the word line to verify whether non-volatile storage elements are programmed to the first data state as a part of the programming, the first reference voltage has a first duration, the second reference voltage has a second duration that is shorter than the first duration.

19. The non-volatile storage device of claim 18, wherein the second duration is not sufficient for the second reference voltage to cause non-volatile storage elements that were intended to be programmed to the first data state and that were past the abnormally high resistance portion of the word line to conduct a current, the first duration is sufficient for the first reference voltage to cause non-volatile storage elements that were intended to be programmed to the first data state and that were past the abnormally high resistance portion of the word line to conduct a current.

20. The non-volatile storage device of claim 18, wherein upon initial application of the first and second reference voltages, a second end of the word line is coupled to a voltage that is greater than the first and second reference voltages by a voltage on an adjacent word line, the second duration is not sufficient for the second end of the word line to return to the second reference voltage, the first duration is sufficient for the second end of the word line to return to the second reference voltage.

21. The non-volatile storage device of claim 19, wherein the one or more management circuits determine whether the non-volatile storage elements that were both intended to be programmed to the first data state and conducted a current in response to the first reference voltage is greater than a threshold number of the non-volatile storage elements as a part of the determining whether the word line has an abnormally high resistance portion.

22. The non-volatile storage device of claim 18, further comprising:
a plurality of sets of latches, each set of latches is associated with one of the non-volatile storage elements in the group, the set of latches associated with each non-volatile storage element includes data latches for storing the data state to be programmed into the non-volatile storage element and an additional latch that serves a purpose in programming other than for storing data state information, the one or more management circuits maintain information in the additional latch associated with each of the non-volatile storage elements in order to maintain the information after programming.

23. The non-volatile storage device of claim 22, wherein the one or more management circuits free up at least one of the data latches prior to completion of programming.

24. A non-volatile storage device comprising:
a plurality of non-volatile storage elements arranged as NAND strings;
a plurality of word lines, a first word line is associated with a group of non-volatile storage elements in the plurality, each of the plurality of word lines having a first end;
one or more management circuits in communication with the plurality of word lines, the one or more management circuits program a group of non-volatile storage elements that are associated with a word line, the non-volatile storage elements are programmed to a plurality of data states, the programming including applying a first reference voltage to a first end of the word line to verify a first data state of the data states, the first reference voltage having a first duration, the one or more management circuits maintain information after the programming is complete that indicates which of the non-volatile storage elements were intended to be programmed to the first data state, the one or more management circuits apply a second reference voltage to the first end of the word line after the programming, the second reference voltage is associated with the first data state, wherein the second reference voltage has a second duration that is longer than the first duration, the one or more management circuits determine results of applying the second reference voltage, the one or more management circuits determine whether the word line is defective based on the results and the maintained information.

25. The non-volatile storage device of claim 24, wherein the first duration is not sufficient for the first reference voltage to cause non-volatile storage elements that were intended to be programmed to the first data state and that were past a break in the word line to conduct a current, the second duration is sufficient for the second reference voltage to cause non-volatile storage elements that were intended to be programmed to the first data state and that were past the break in the word line to conduct a current.

26. The non-volatile storage device of claim 25, wherein the one or more management circuits determined whether the non-volatile storage elements that were both intended to be programmed to the first data state and conducted a current in response to the second reference voltage is greater than a threshold number of the non-volatile storage elements as a part of the determining whether the word line is defective.

* * * * *